(12) United States Patent
Hu et al.

(10) Patent No.: US 11,062,915 B2
(45) Date of Patent: Jul. 13, 2021

(54) REDISTRIBUTION STRUCTURES FOR SEMICONDUCTOR PACKAGES AND METHODS OF FORMING THE SAME

(71) Applicant: Taiwan Semiconductor Manufacturing Company, Ltd., Hsinchu (TW)

(72) Inventors: Yu-Hsiang Hu, Hsinchu (TW); Hung-Jui Kuo, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/058,692

(22) Filed: Aug. 8, 2018

(65) Prior Publication Data
US 2019/0304803 A1    Oct. 3, 2019

Related U.S. Application Data

(60) Provisional application No. 62/650,006, filed on Mar. 29, 2018.

(51) Int. Cl.
*H01L 21/48* (2006.01)
*H01L 23/00* (2006.01)
(Continued)

(52) U.S. Cl.
CPC ........ *H01L 21/4857* (2013.01); *H01L 21/486* (2013.01); *H01L 21/4853* (2013.01); *H01L 21/561* (2013.01); *H01L 21/6835* (2013.01); *H01L 23/49822* (2013.01); *H01L 24/13* (2013.01); *H01L 21/568* (2013.01); *H01L 2221/68331* (2013.01); *H01L 2224/10122* (2013.01); *H01L 2924/19106* (2013.01)

(58) Field of Classification Search
CPC ....... H01L 24/13; H01L 23/49; H01L 23/498; H01L 23/4982; H01L 23/49822; H01L 21/48; H01L 21/485; H01L 21/486; H01L 21/4853; H01L 21/56; H01L 21/561; H01L 21/68; H01L 21/683; H01L 21/6835; H01L 21/4857; H01L 21/568; H01L 2221/68331; H01L 2224/10122; H01L 2924/19106
USPC ....................................... 257/774
See application file for complete search history.

(56) References Cited

U.S. PATENT DOCUMENTS 6,902,987 B1 * 6/2005 Tong .................. H01L 21/0206
                                                              438/455
8,361,842 B2    1/2013 Yu et al.
(Continued)

*Primary Examiner* — Monica D Harrison
(74) *Attorney, Agent, or Firm* — Slater Matsil, LLP

(57) ABSTRACT

A method for forming a redistribution structure in a semiconductor package and a semiconductor package including the redistribution structure are disclosed. In an embodiment, the method may include encapsulating an integrated circuit die and a through via in a molding compound, the integrated circuit die having a die connector; depositing a first dielectric layer over the molding compound; patterning a first opening through the first dielectric layer exposing the die connector of the integrated circuit die; planarizing the first dielectric layer; depositing a first seed layer over the first dielectric layer and in the first opening; and plating a first conductive via extending through the first dielectric layer on the first seed layer.

20 Claims, 19 Drawing Sheets

(51) Int. Cl.
    *H01L 21/56*     (2006.01)
    *H01L 23/498*     (2006.01)
    *H01L 21/683*     (2006.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,543,224 | B1 * | 1/2017 | Meyer ................ H01L 21/4853 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2019/0067224 | A1 * | 2/2019 | Furuichi ................ H01L 24/03 |
| 2019/0148301 | A1 * | 5/2019 | Huang ................ H01L 23/5383 |
| | | | 257/774 |

\* cited by examiner

REDISTRIBUTION STRUCTURES FOR SEMICONDUCTOR PACKAGES AND METHODS OF FORMING THE SAME

PRIORITY CLAIM AND CROSS-REFERENCE

This application claims the benefit of U.S. Provisional Application No. 62/650,006, filed on Mar. 29, 2018, entitled "Semiconductor Device and Method of Manufacture," which patent application is incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques for semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
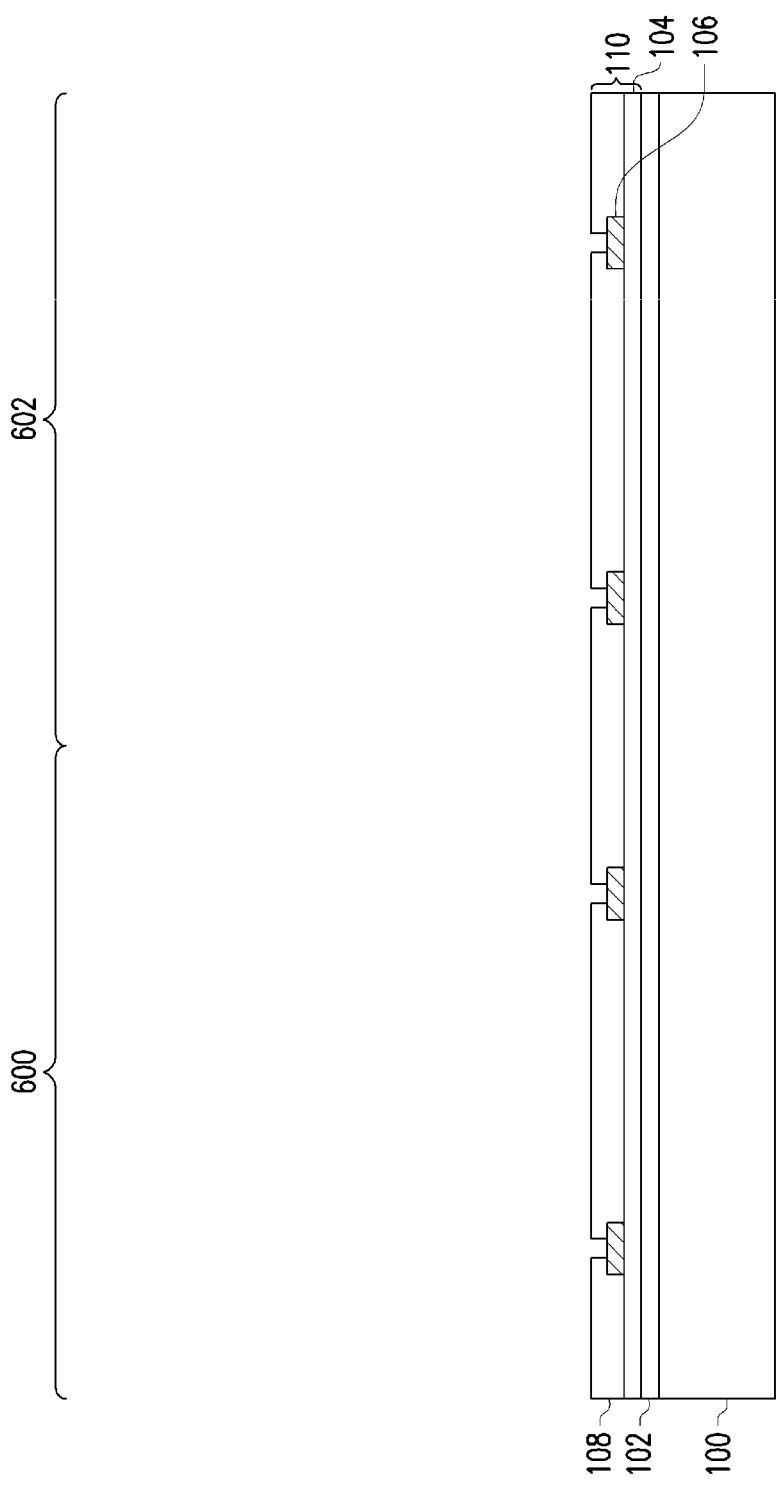
FIG. 1 illustrates a redistribution structure formed over a substrate in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein relate to redistribution structures and methods of forming redistribution structures for use in various semiconductor packages. In some embodiments, the redistribution structures may include dielectric layers, metallization patterns, and vias. The redistribution structures may be formed by forming a dielectric layer over a semiconductor wafer, planarizing the dielectric layer, forming a photoresist over the dielectric layer, exposing the photoresist across the entire surface of the semiconductor wafer using an aligner, developing the photoresist to form openings in the photoresist, forming metallization patterns and vias in the openings, and removing the photoresist. This process may be repeated until a redistribution structure having a desired structure and thickness is formed.

Using the aligner to expose the photoresist allows the entire surface of the wafer to be exposed at the same time. Thus there is no need to perform multiple exposures and there is no stitching between exposures. This further prevents overlay shift issues between multiple exposures. Reducing overlay shift means that redistribution structures can be formed with a finer pitch. Moreover, planarizing each dielectric layer improves the degree of planarization (DoP) of each layer and the overall redistribution structure.

Figure 5:
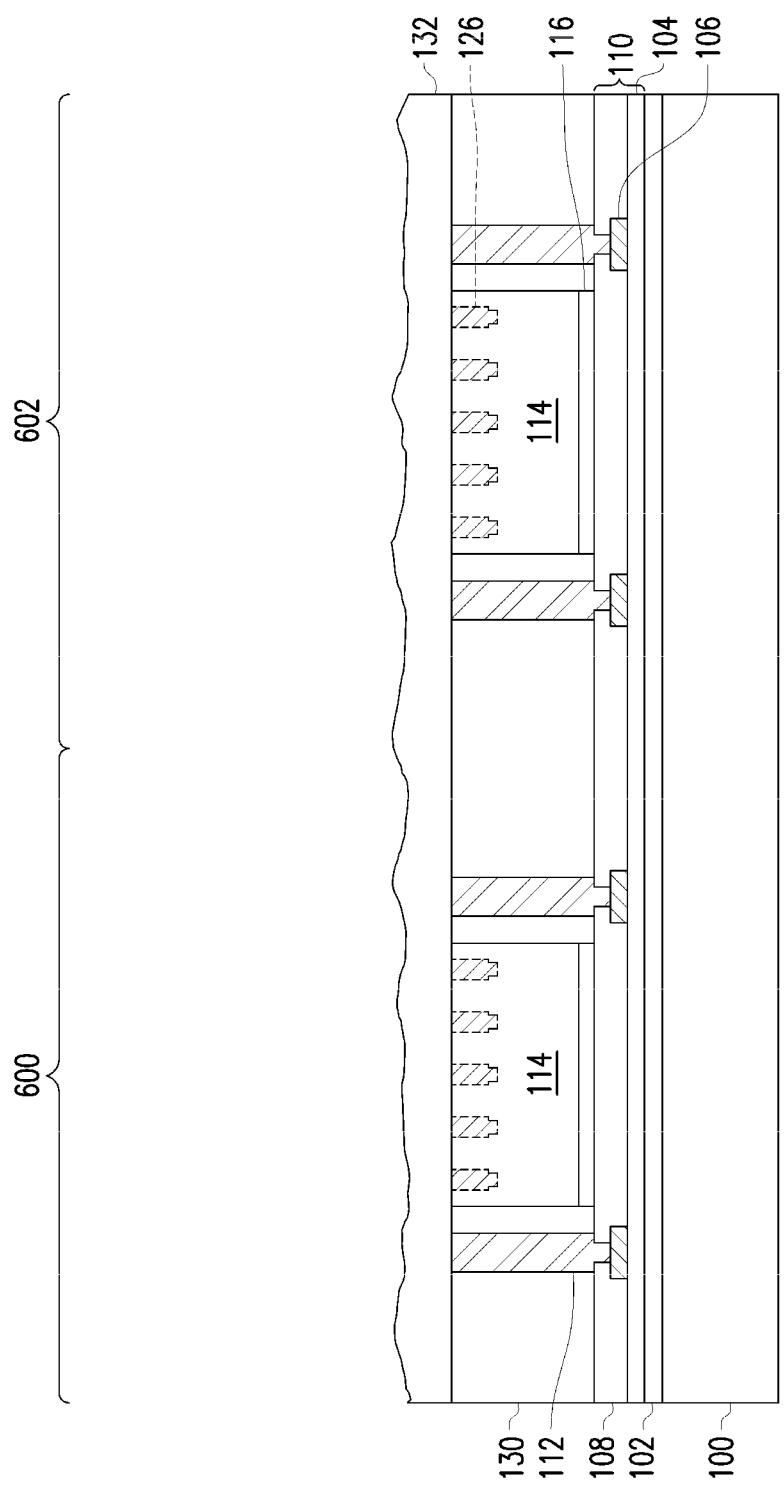
FIG. 5 illustrates a formation of a dielectric layer in accordance with some embodiments.
Figure 6A:
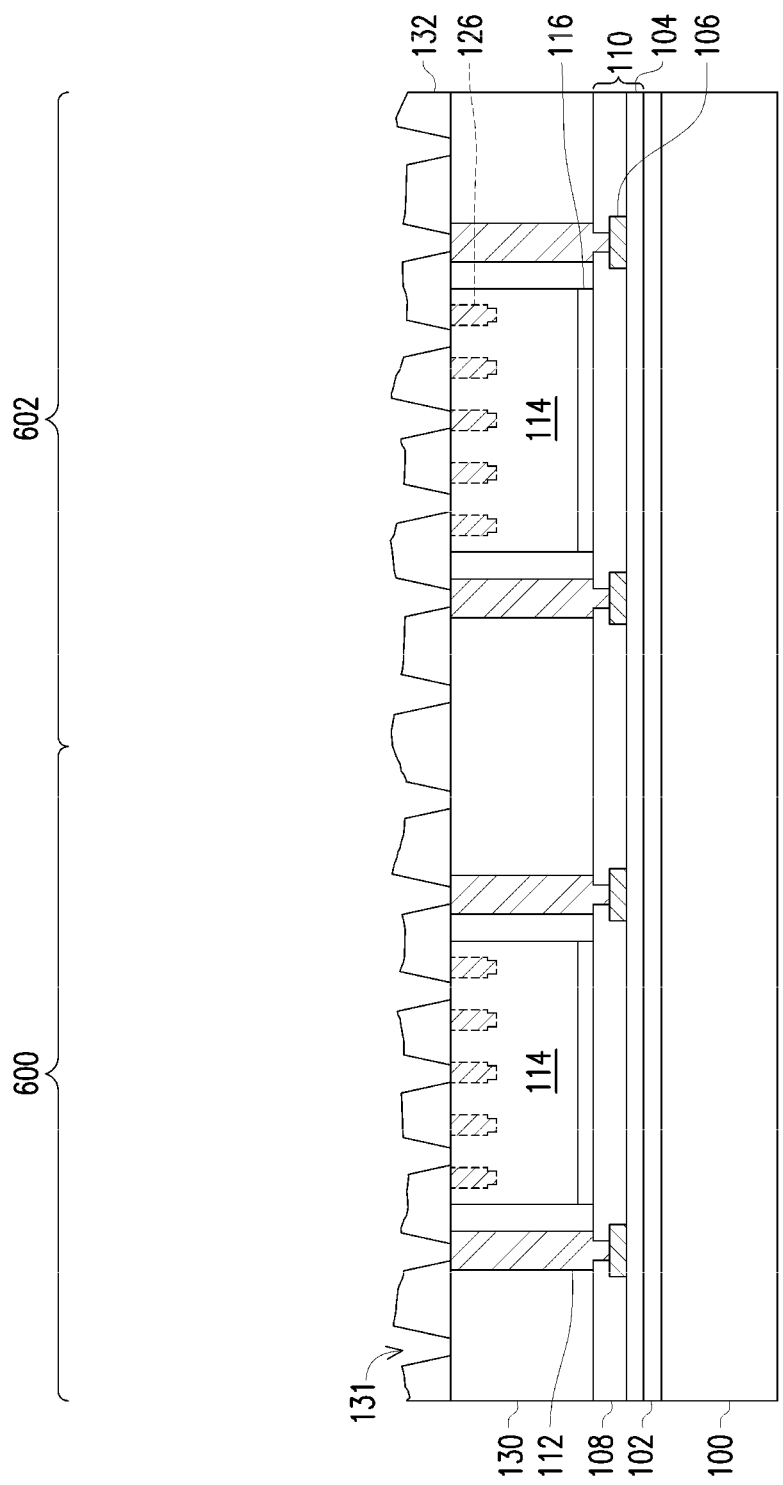
FIG. 6A illustrates a patterning of the dielectric layer in accordance with some embodiments.
Figure 6B:
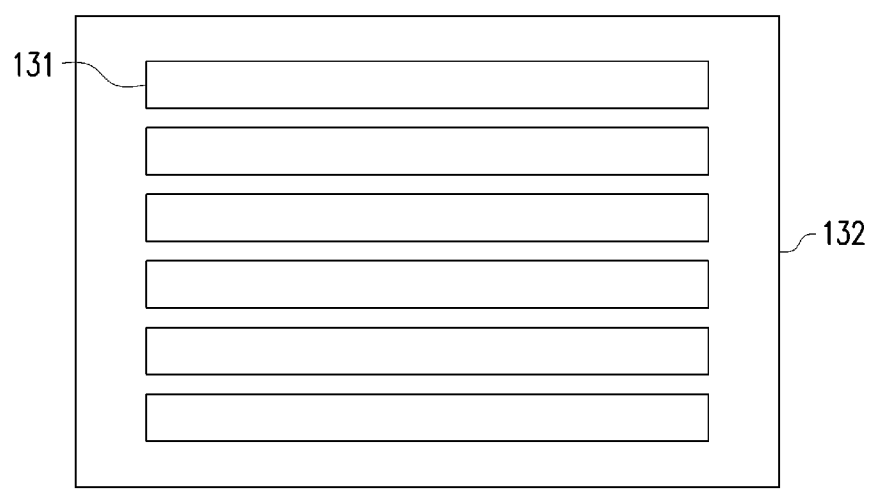
FIG. 6B illustrates a top-down view of the patterned dielectric layer in accordance with some embodiments.

FIGS. 1 through 18 illustrate cross-sectional views (FIG. 6B illustrates a top-down view) of intermediate steps during a process for forming a semiconductor package 200 (not illustrated in FIGS. 1-17, but illustrated in FIG. 18), in accordance with some embodiments. The semiconductor package 200 may also be referred to as an integrated fan-out (InFO) package. FIG. 1 illustrates a carrier substrate 100 and a release layer 102 formed on the carrier substrate 100. A first package region 600 and a second package region 602 for the formation of the semiconductor packages 200 are also illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The carrier substrate 100 may be circular and may have a diameter of about 300 mm, about 450 mm, about 200 mm, or any other suitable diameter. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV light. The release layer 102 may be dispensed as a liquid and cured, may be a laminate film laminated onto the carrier substrate 100, or may be the like. The top surface of the release layer 102 may be leveled and may have a high degree of planarity.

A dielectric layer 104 and a metallization pattern 106 (sometimes referred to as a redistribution layer or redistribution line) are formed over the release layer 102. As illustrated in FIG. 1, the dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example, the metallization pattern 106 may be formed by forming a seed layer (not separately illustrated) over the dielectric layer 104. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD or the like.

A photoresist is then formed and patterned on the seed layer. The photoresist may be formed by spin coating or the like and may be exposed to a patterned energy source (e.g., a patterned light source) and developed for patterning. The pattern of the photoresist corresponds to the metallization pattern 106. The patterning forms openings through the photoresist to expose the seed layer.

A conductive material is then formed in the openings of the photoresist and on the exposed portions of the seed layer. The conductive material may be formed by plating, such as electroplating, electroless plating, or the like. The conductive material may comprise a metal, such as copper, titanium, tungsten, aluminum, or the like. The photoresist and portions of the seed layer on which the conductive material is not formed may then be removed. The photoresist may be removed by any acceptable process, such as by an ashing process, a stripping process, or the like. In an embodiment, an oxygen plasma may be used to remove the photoresist. Once the photoresist is removed, exposed portions of the seed layer are removed. The portions of the seed layer may be removed by any acceptable etching process, such as a wet etching process, a dry etching process, or the like. The conductive material and the remaining portions of the seed layer together form the metallization pattern 106.

A dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The dielectric layer 108 may be patterned by any acceptable process, such as exposure to a patterned energy source (e.g., a patterned light source) and development when the dielectric layer 108 is formed of a photo-sensitive material; by etching using, for example, an anisotropic etch; or the like. As will be discussed in greater detail below, the dielectric layer 108 may be exposed to the patterned energy source using an aligner such that there is no stitching or overlay shift in the openings formed in the dielectric layer 108.

The dielectric layers 104 and 108 and the metallization pattern 106 may be referred to as a back-side redistribution structure 110. In some embodiments, the back-side redistribution structure 110 can include any number of dielectric layers, metallization patterns, and vias. One or more additional metallization patterns and dielectric layers may be formed in the back-side redistribution structure 110 by repeating the processes for forming the metallization pattern 106 and the dielectric layer 108. Vias may be formed during the formation of the metallization patterns by forming the seed layer and the conductive material of the metallization patterns in openings formed in the underlying dielectric layer. The vias may therefore interconnect and electrically couple the various metallization patterns.

Figure 2:
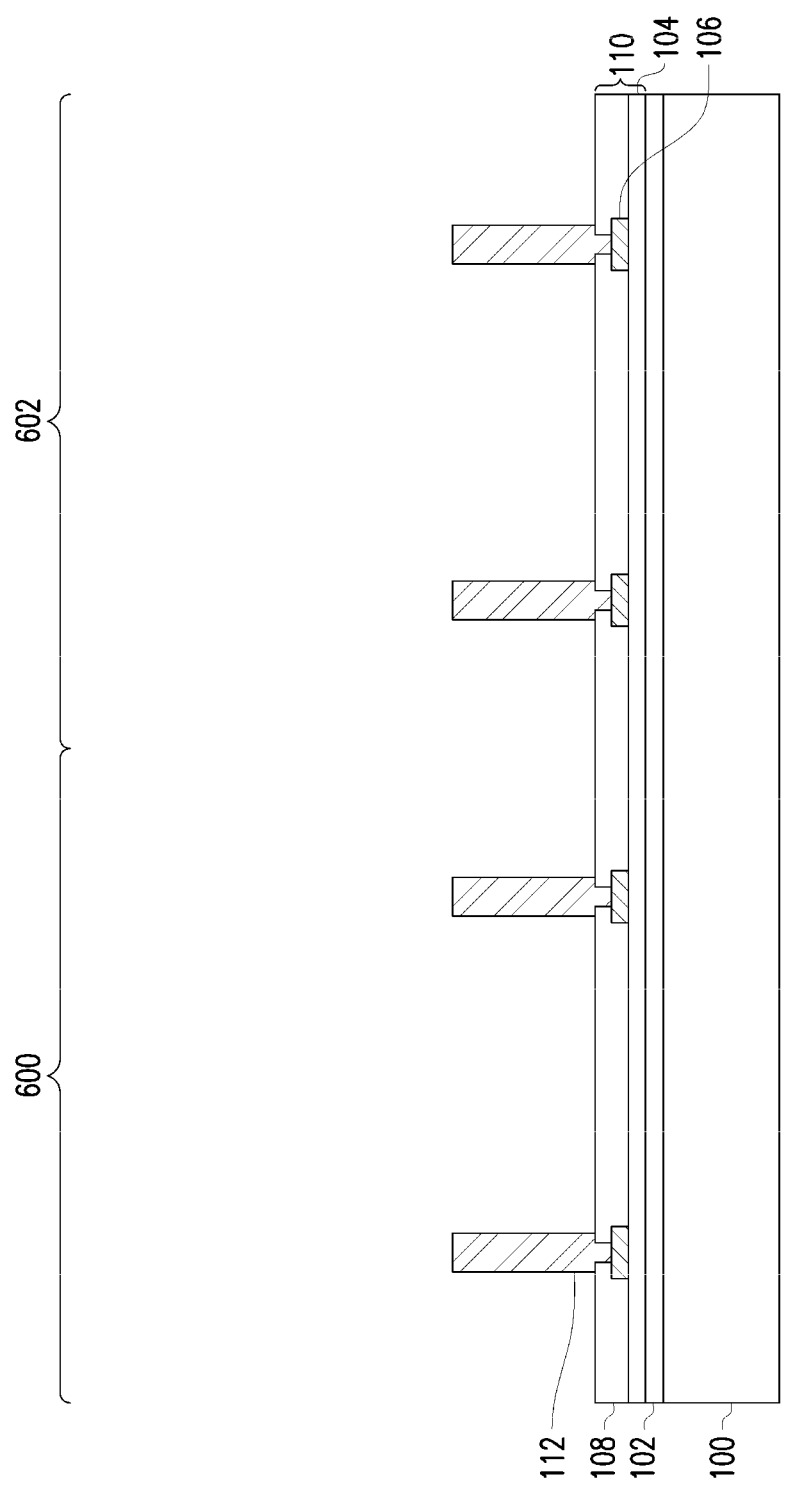
FIG. 2 illustrates a formation of through vias in accordance with some embodiments.

In FIG. 2, through vias 112 are formed over the back-side redistribution structure 110. The through vias 112 may be formed by forming a seed layer (not separately illustrated) over the back-side redistribution structure 110, e.g., the dielectric layer 108 and exposed portions of the metallization pattern 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to a patterned energy source (e.g., a patterned light source) and developed for patterning. As will be discussed in greater detail below, the photoresist may be exposed to the patterned energy source using an aligner such that there is no stitching or overlay shift in the through vias 112. The pattern of the photoresist corresponds to the through vias 112 to be formed. The patterning forms openings through the photoresist to expose portions of the seed layer. A conductive material is formed in the openings of the photoresist and on the exposed portions of the seed layer. The conductive material may be formed by plating, such as electroplating, electroless plating, or the like. The conductive material may comprise a metal such as copper, titanium, tungsten, aluminum, or the like. The photoresist and portions of the seed layer on which the conductive material is not formed are removed. The photoresist may be removed by any acceptable process, such as an ashing process, a stripping process, or the like. In some embodiments, oxygen plasma may be used to remove the photoresist. Once the photoresist is removed, exposed portions of the seed layer are removed by any acceptable etching process, such as by wet etching, dry etching, or the like. The remaining portions of the seed layer and the conductive material form the through vias 112.

Figure 3:
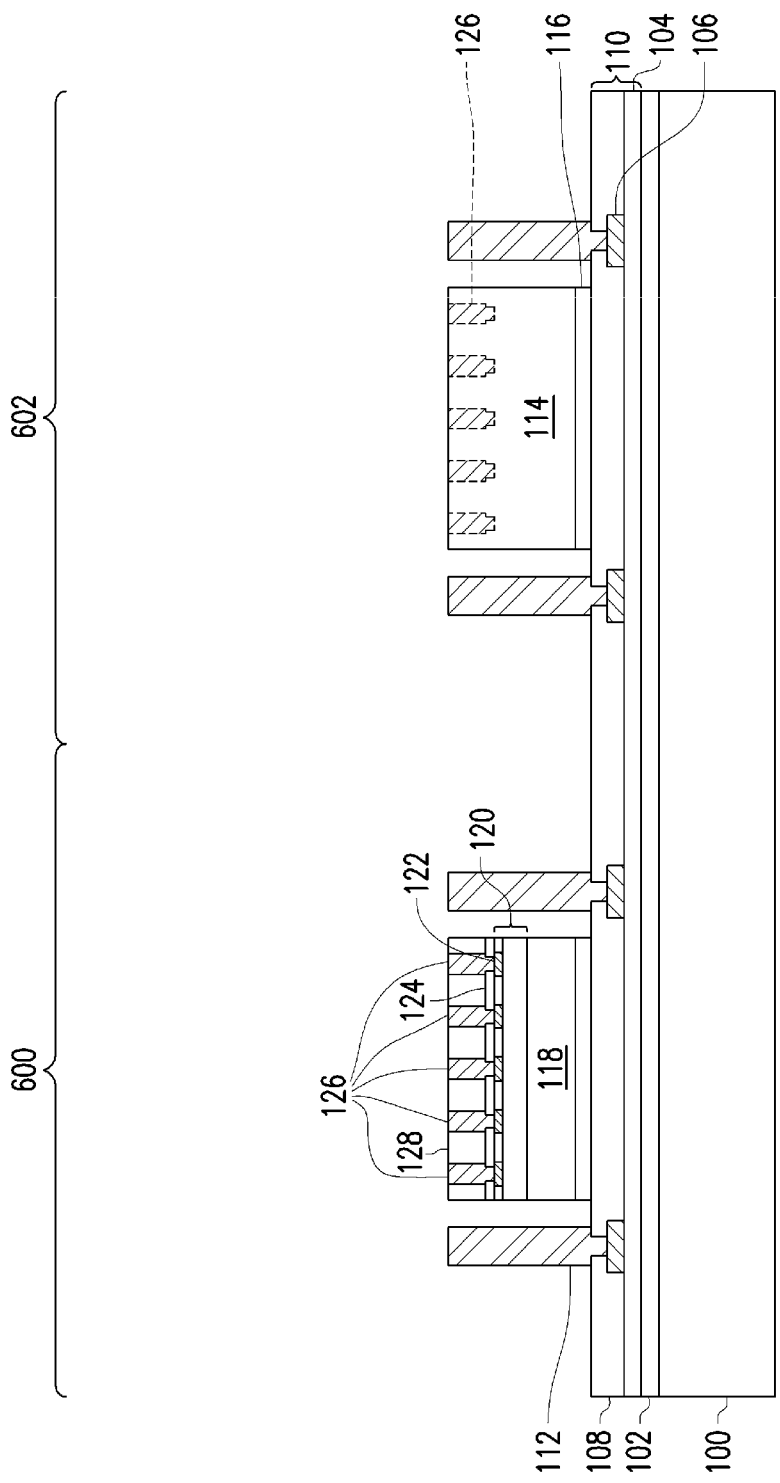
FIG. 3 illustrates a placement of integrated circuit dies in accordance with some embodiments.

In FIG. 3, integrated circuit dies 114 are adhered to the dielectric layer 108 by an adhesive 116. As illustrated in FIG. 3, one integrated circuit die 114 may be adhered in each of the first package region 600 and the second package region 602. In other embodiments, more integrated circuit dies may be adhered in each region. For example, in an embodiment, two or more integrated circuit dies 114 may be adhered in each region. The integrated circuit dies 114 may be logic dies (e.g., central processing units, microcontrollers, etc.), memory dies (e.g., dynamic random access memory (DRAM) dies, static random access memory (SRAM) dies, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., the same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate 118 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 may further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings extend through the passivation films 124 to the pads 122. Die connectors 126 (illustrated in FIG. 3 and illustrated in subsequent figures in dashed lines), such as conductive pillars (comprising, for example, a metal such as copper), are formed in the openings through the passivation films 124 and are mechanically and electrically coupled to the respective pads. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 4:
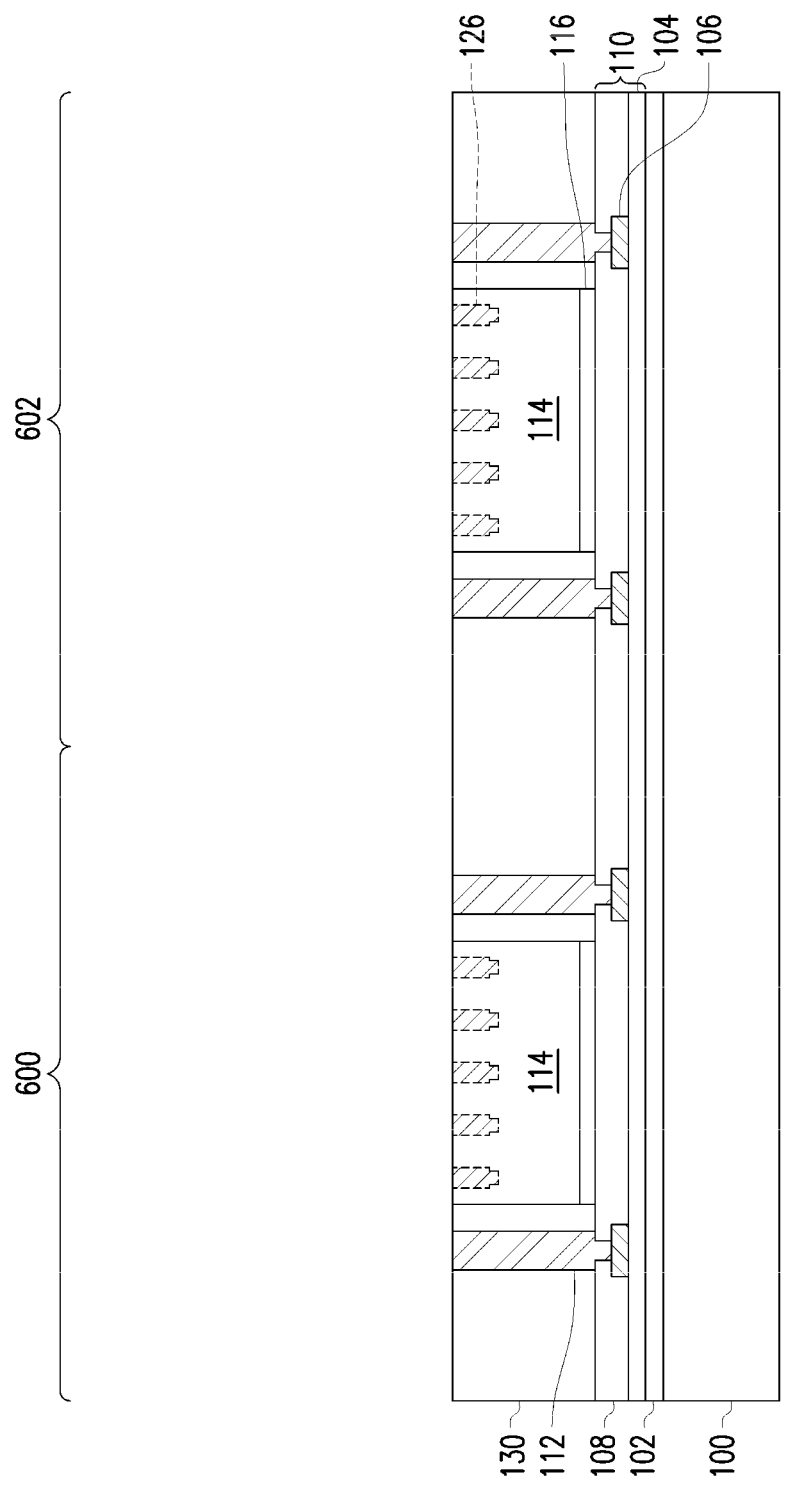
FIG. 4 illustrates an encapsulation with an encapsulant in accordance with some embodiments.

In FIG. 4, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and the die connectors 126. Top surfaces of the through vias 112, the die connectors 126, and the encapsulant 130 are coplanar after the grinding process. In some embodiments, the grinding may be omitted, for example, if the through vias 112 and the die connectors 126 are already exposed.

In FIGS. 5 through 15, a front-side redistribution structure 160 (not illustrated in FIGS. 5-14, but illustrated in FIG. 15) is formed. As will be illustrated in FIG. 15, the front-side redistribution structure 160 includes a dielectric layer 132, a dielectric layer 140, a dielectric layer 148, a dielectric layer 156, a metallization pattern 138, a metallization pattern 146, and a metallization pattern 154 (the metallization pattern 138, the metallization pattern 146, and the metallization pattern 154 may sometimes be referred to as redistribution layers or redistribution lines).

Figure 7:
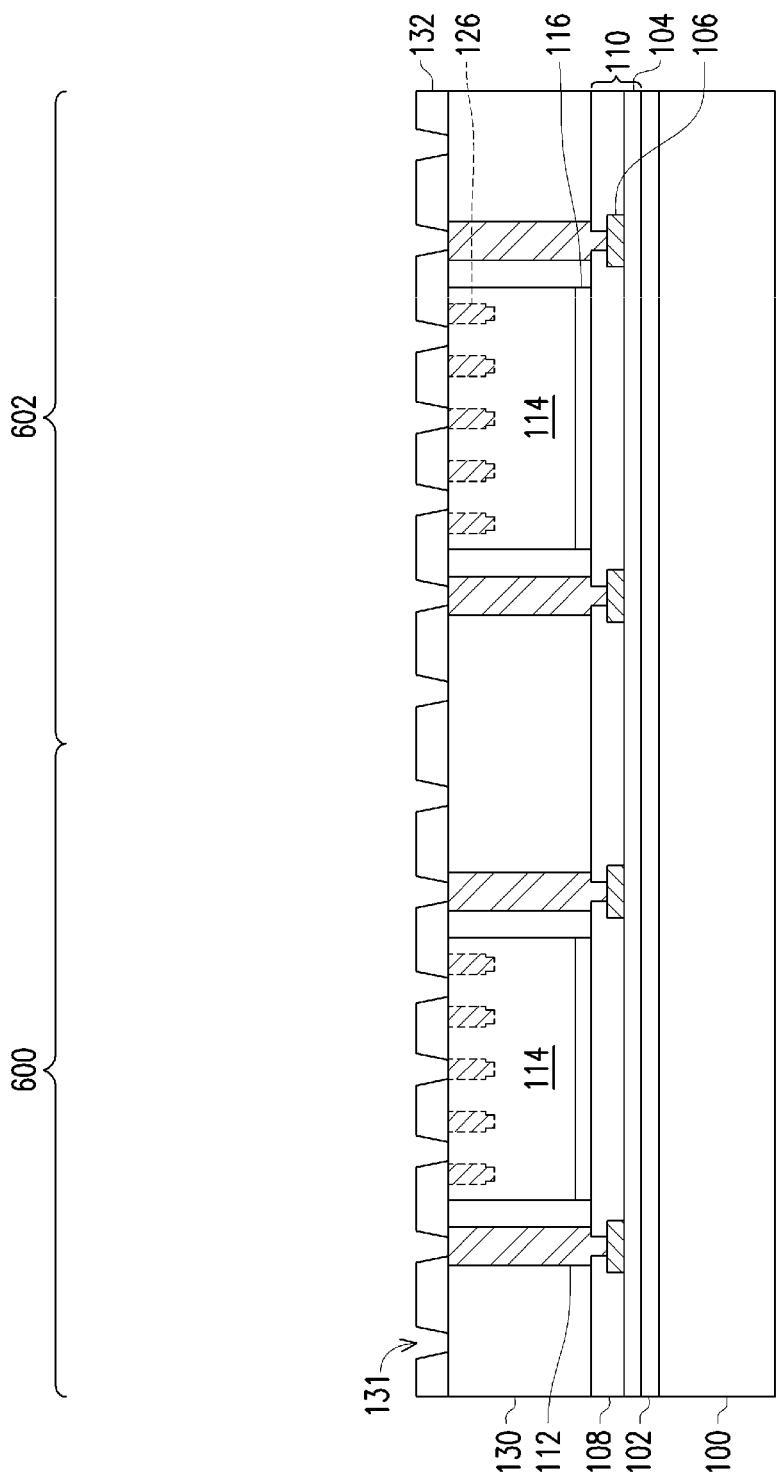
FIG. 7 illustrates a planarization of the dielectric layer in accordance with some embodiments.

In FIGS. 5-7, a dielectric layer 132 is formed on the encapsulant 130, the through vias 112, and the integrated circuit dies 114 and then the dielectric layer 132 is patterned and planarized. In FIG. 5, the dielectric layer 132 is formed over the encapsulant 130, the through vias 112, and the integrated circuit dies 114. As illustrated in FIG. 5, an uppermost surface of the dielectric layer 132 may be wavy or otherwise non-planar. In some embodiments, the dielectric layer 132 is formed of a polymer, which may be a photo-sensitive material such as PBO, polyimide, BCB, or the like, that may be patterned using a lithography mask and developing. In other embodiments, the dielectric layer 132 is formed of a nitride such as silicon nitride; an oxide such as silicon oxide, PSG, BSG, BPSG; or the like. In embodiments in which the dielectric layer 132 is formed of a material which is not photo-sensitive, the dielectric layer 132 may be patterned by forming a photoresist (not separately illustrated) over the dielectric layer 132, patterning the photoresist by the methods described below, and etching through the photoresist to pattern the dielectric layer 132. The dielectric layer 132 may be deposited by spin coating, lamination, CVD, the like, or a combination thereof.

After the dielectric layer 132 is deposited, the dielectric layer 132 is exposed and developed to form openings 131, as illustrated in FIGS. 6A and 6B. The exposure may be by any acceptable process, such as by exposing the dielectric layer 132 to a patterned energy source (e.g., a patterned light source) when the dielectric layer 132 is a photo-sensitive material. In some embodiments, an aligner is used to expose the dielectric layer 132 to the patterned energy source such that an entire surface the dielectric layer 132 formed over the carrier substrate 100 is exposed simultaneously. The aligner may be a contact aligner, a proximity aligner, or any other suitable type of aligner. In embodiments in which the aligner is a contact aligner, a contact photomask (not separately illustrated) may be in direct contact with the top surface of the dielectric layer 132 and the dielectric layer 132 may be exposed to the patterned energy source through the contact photomask. In embodiments in which the aligner is a proximity aligner, a proximity photomask (not separately illustrated) may be separated from the top surface of the dielectric layer 132 by a gap and the dielectric layer 132 may be exposed to the patterned energy source through the proximity photomask. The gap may be a distance of between about 10 mm and about 150 mm, such as about 55 mm, and the gap may be filled with a gas, such as nitrogen ($N_2$).

The contact photomask, the proximity photomask, or any other photomask in the aligner may cover the entire surface of the dielectric layer 132 such that the entire surface of the dielectric layer 132 may be exposed by the aligner at the same time. In some embodiments, the carrier substrate 100 has a diameter of between about 200 mm and about 350 mm or between about 200 mm and about 450 mm, such as about 300 mm and the photomask may have a diameter of between about 200 mm and about 350 mm or between about 200 mm and about 450 mm, such as about 350 mm.

The aligner may be used in place of a stepper (sometimes referred to as a step-and-repeat camera). A stepper may be used to expose a top surface of a wafer to a patterned energy source one frame at a time by passing an energy source through a reticle to form an image of the reticle pattern on the surface of the wafer. The stepper is then moved to the next frame and this process is repeated across the surface of the wafer. The frame size for the stepper may be about 26 mm by about 66 mm, about 34 mm by about 52 mm, or the like. The technique of exposing the top surface of a wafer one frame at a time is referred to as the stitch technique. The stepper is moved and aligned before exposing each frame, which may result in overlays (e.g. overlaps) or offsets (e.g., misalignments) between line-end areas in adjacent frames at the stitch interface (e.g., the frame-to-frame interface). The line-end to line-end overlay and/or offset may be referred to as stitching. The stitch technique may further result in overlay shift (e.g., partial lands) between subsequently formed vias and lines in different layers of the semiconductor packages 200. Because the aligner simultaneously exposes the entire top surface of the dielectric layer 132, there may be no stitching in the dielectric layer 132, or in subsequently formed dielectric layers, vias, and lines in the semiconductor packages 200. Moreover, the overlay shift between vias and lines in adjacent layers in the semiconductor packages may be between about 0.25 µm and about 1.0 µm, such as about 0.5 µm, less than 6 µm, or less than 2 µm.

After the dielectric layer 132 is exposed, the dielectric layer 132 may be developed by applying a developer solution to the dielectric layer 132. The dielectric layer 132 may be developed by a positive tone development process or a negative tone development process. In embodiments in which the dielectric layer 132 is developed by a positive tone development process, portions of the dielectric layer 132 which were exposed to the patterned energy source become soluble to the developer solution and are removed by the developer solution. In embodiments in which the dielectric layer 132 is developed by a negative tone development process, portions of the dielectric layer 132 which were exposed to the patterned energy source become insoluble to the developer solution and portions of the dielectric layer 132 which were not exposed to the patterned energy source are removed by the developer solution. Thus, the openings 131 are formed in the dielectric layer 132, as illustrated in FIGS. 6A and 6B.

FIG. 6B illustrates a top-down view of the dielectric layer 132 including the openings 131. Because the aligner exposes the entire top surface of the dielectric layer 132 to the patterned energy source at the same time, there is no stitching between multiple frames. Likewise, any overlay shift in subsequently formed metallization patterns (such as the metallization pattern 138, the metallization pattern 146, and the metallization pattern 154, illustrated in FIGS. 10, 12, and 14, respectively) in adjacent frames is reduced or eliminated. For example, the overlay shift may be less than about 2 µm, between about 0.3 µm and about 1.0 µm, or about 0 µm. As such, the subsequently formed metallization patterns make full lands on underlying metal layers and the metallization patterns may be formed with smaller critical dimensions. In some embodiments, metallization patterns having a pitch of between about 1.0 and about 10 may be formed using the above-described methods.

After the dielectric layer 132 is patterned to form the openings 131, the dielectric layer 132 is planarized, as illustrated in FIG. 7. However, in other embodiments, the dielectric layer 132 may be planarized before the dielectric layer 132 is patterned to form the openings 131. The dielectric layer 132 may be planarized using any suitable process, such as a CMP process, grinding, an etch planarization process, or the like. The planarization process may improve a degree of planarization (DoP) of the dielectric layer 132 from less than about 48.6 percent to greater than about 95 percent. In some embodiments, the dielectric layer 132 may be planarized to a DoP of between about 48 percent and less than about 100 percent, or about 100 percent. Planarizing the dielectric layer 132 before forming the metallization pattern 138 or before forming the openings 131 helps to enlarge the lithographic processing window such that the entire surface of the dielectric layer 132 can be simultaneously exposed using an aligner, rather than exposing frames on the surface of the dielectric layer 132 one at a time in a shot-by-shot process using a stepper. As described above, using the aligner rather than the stepper can eliminate stitching between frames, and reduce any overlay shift in the subsequently formed metallization pattern 138.

Figure 8:
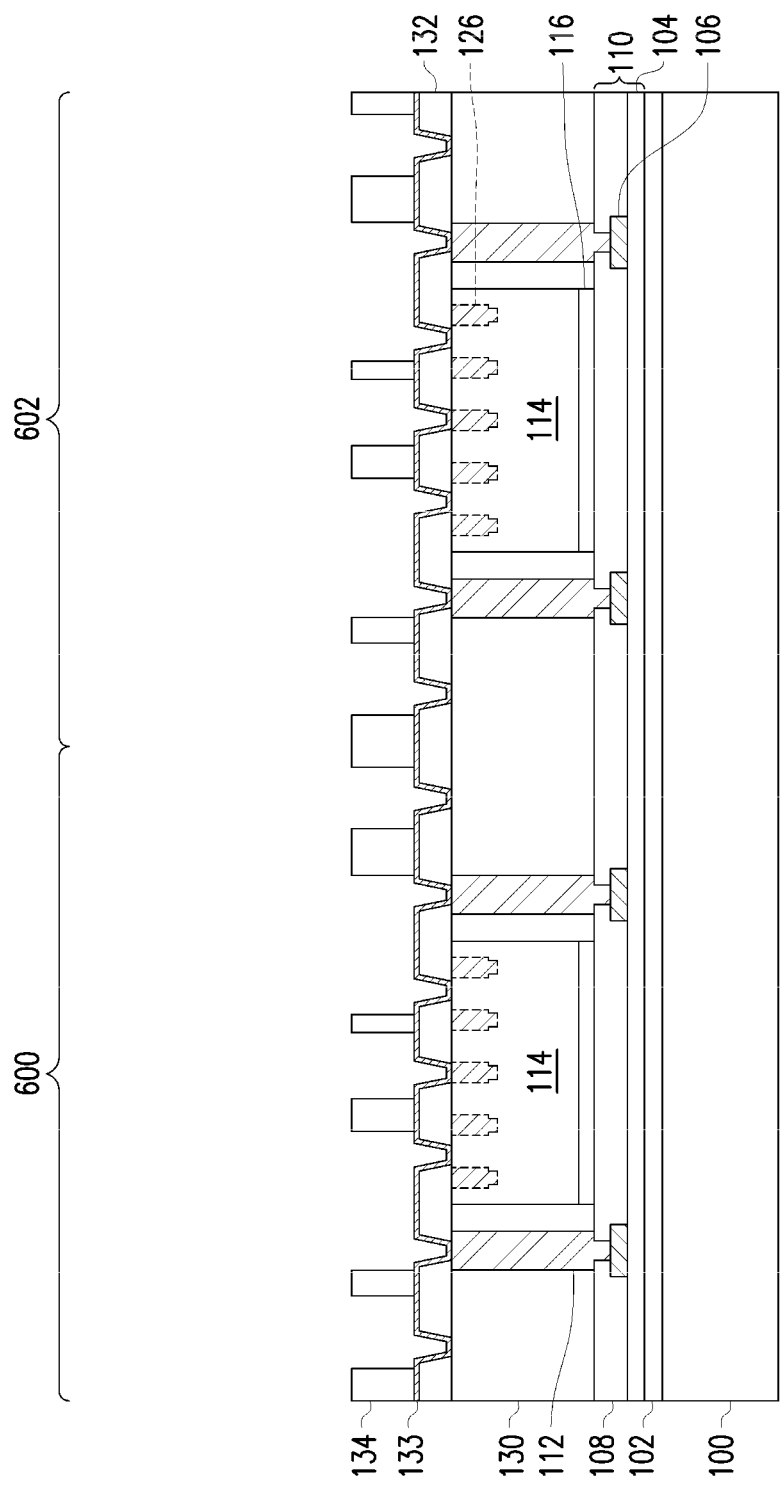
FIG. 8 illustrates a formation of a seed layer and a photoresist in accordance with some embodiments.
Figure 9:
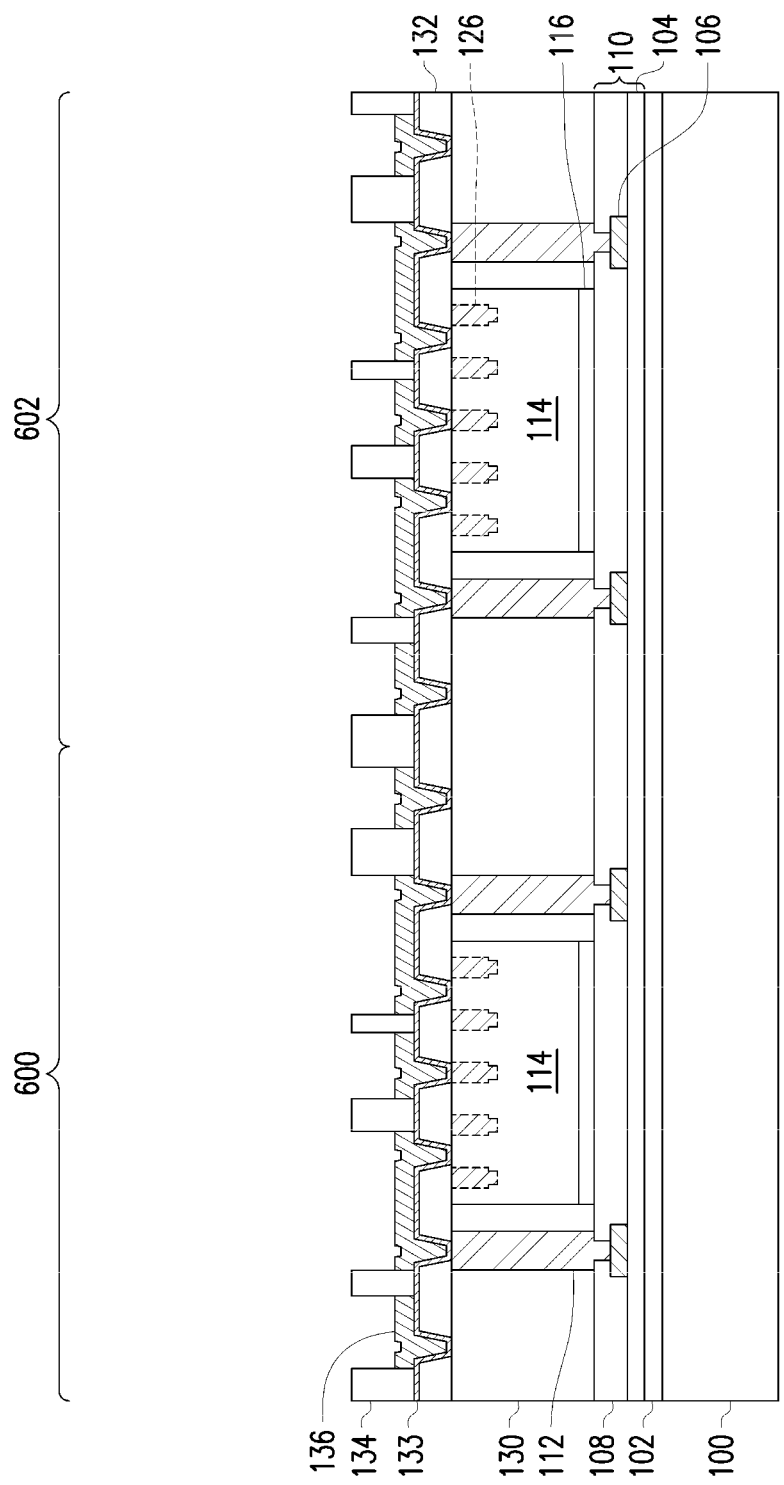
FIG. 9 illustrates a formation of a conductive material in accordance with some embodiments.
Figure 10:
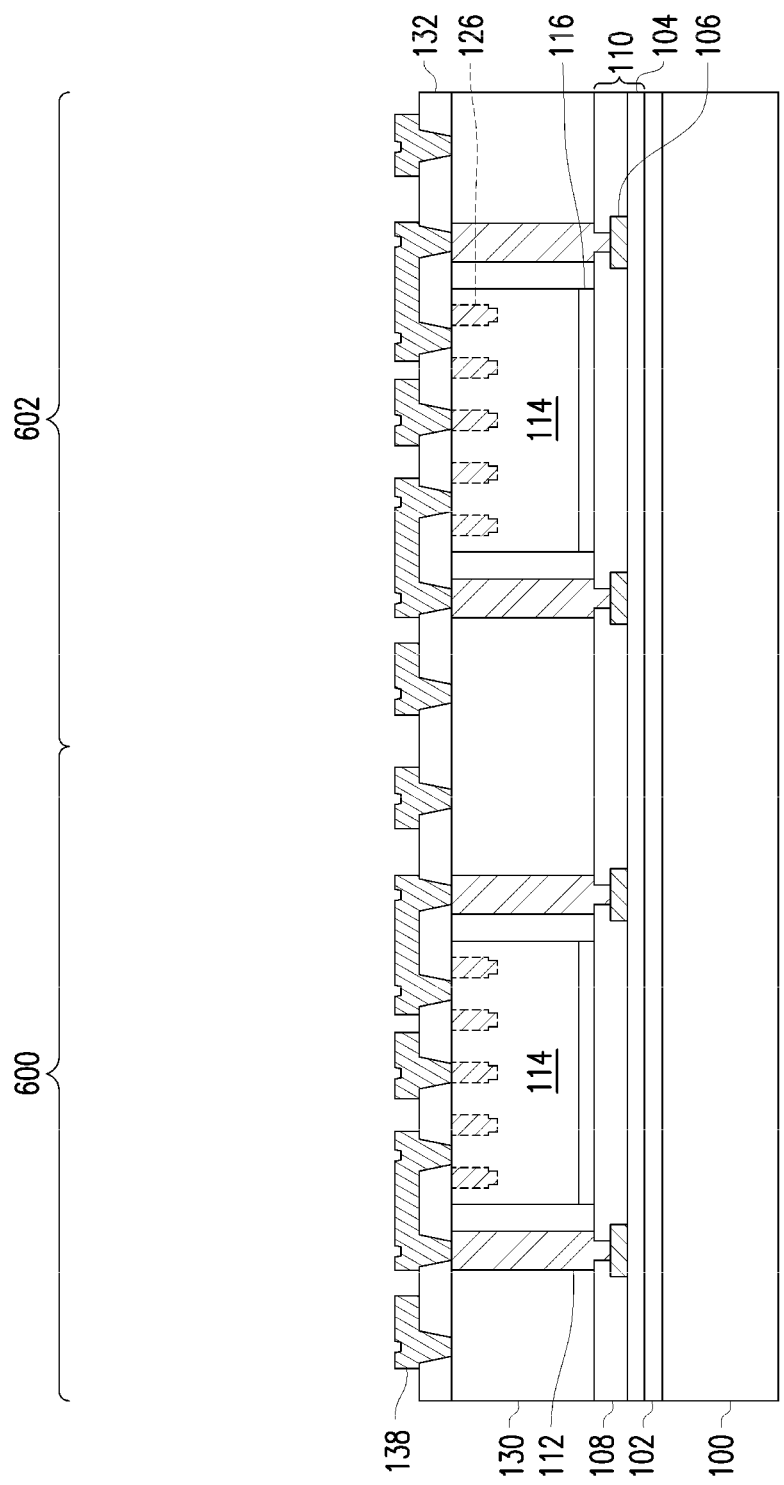
FIG. 10 illustrates a removal of the photoresist and a formation of a metallization pattern in accordance with some embodiments.

In FIGS. 8-10, a metallization pattern 138 with vias is formed on the dielectric layer 132. As illustrated in FIG. 8, the metallization pattern 138 may be formed by forming a seed layer 133 over the dielectric layer 132 and in the openings through the dielectric layer 132. In some embodiments, the seed layer 133 is a metal layer, which may be a single layer or a composite layer comprising a plurality of sub-layers formed of different materials. In some embodiments, the seed layer 133 comprises a titanium layer and a copper layer over the titanium layer. The seed layer 133 may be formed using, for example, PVD or the like.

A photoresist 134 is then formed and patterned on the seed layer 133. The photoresist 134 may be formed by spin coating or the like and may be exposed to a patterned energy source and developed for patterning. For example, an aligner may be used to expose the photoresist 134 to a patterned energy source (e.g., a patterned light source) such that an entire surface of the photoresist 134 formed over the carrier substrate 100 is exposed simultaneously. In embodiments in which the carrier substrate 100 has a diameter of 300 mm, a mask having a diameter of about 14 inches may be used such that the entire surface of the carrier substrate 100 may be exposed by the aligner at the same time. The pattern of the photoresist 134 corresponds to the metallization pattern 138. The patterning forms openings through the photoresist 134 to expose the seed layer 133.

In FIG. 9, a conductive material 136 is formed in the openings of the photoresist 134 and on the exposed portions of the seed layer 133. The conductive material 136 may be formed by plating, such as electroplating or electroless plating, or the like. The conductive material 136 may comprise a metal, like copper, titanium, tungsten, aluminum, or the like.

In FIG. 10, the photoresist 134 and portions of the seed layer 133 on which the conductive material 136 is not formed are removed. The photoresist 134 may be removed by an acceptable ashing or stripping process, such as using an oxygen plasma or the like. Once the photoresist 134 is removed, exposed portions of the seed layer 133 are removed using an acceptable etching process, such as a wet etching process or a dry etching process. The remaining portions of the seed layer 133 and the conductive material 136 form the metallization pattern 138 and the vias. The vias are formed in the openings extending through the dielectric layer 132 to, e.g., the through vias 112 and/or the die connectors 126 of the integrated circuit dies 114. Because the openings 131 were formed in the dielectric layer 132 by an aligner, rather than a stepper or the like, the metallization pattern 138 is free from stitching and any overlay shift is less than about 2 μm, between about 0.3 μm and about 0.1 μm, or about 0 μm.

Figure 11:
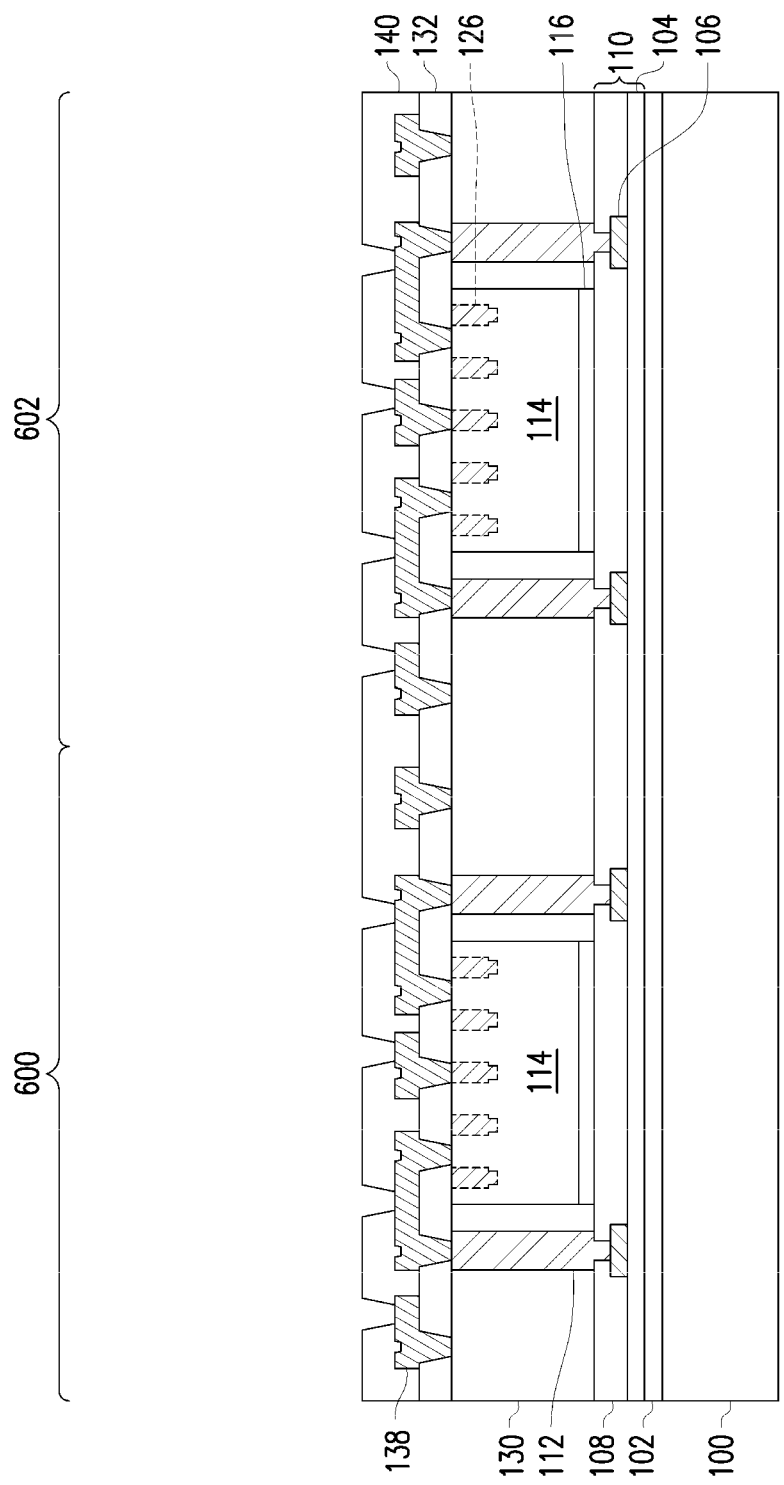
FIG. 11 illustrates a formation of a dielectric layer in accordance with some embodiments.

In FIG. 11, a dielectric layer 140 is deposited on the metallization pattern 138 and the dielectric layer 132. The dielectric layer 140 may be formed of the same or similar materials and by the same or similar methods as the dielectric layer 132. For example, in some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. In embodiments in which the dielectric layer 140 is formed of a material which is not photo-sensitive, the dielectric layer 140 may be patterned by forming a photoresist (not separately illustrated) over the dielectric layer 140, patterning the photoresist by the methods described below, and etching through the photoresist to pattern the dielectric layer 140. The dielectric layer 140 may be formed by spin coating, lamination, CVD, the like, or a combination thereof. The dielectric layer 140 may be patterned and planarized by the same or similar methods to the dielectric layer 132. For example, the dielectric layer 140 may be exposed using an aligner, developed to form openings extending through the dielectric layer 140 and exposing portions of the metallization pattern 138, and planarized using a process such as a CMP process, grinding, or an etch planarization process, as described above in reference to the dielectric layer 132. In some embodiments, the dielectric layer 140 may be planarized before forming the openings exposing the portions of the metallization pattern 138.

Figure 12:
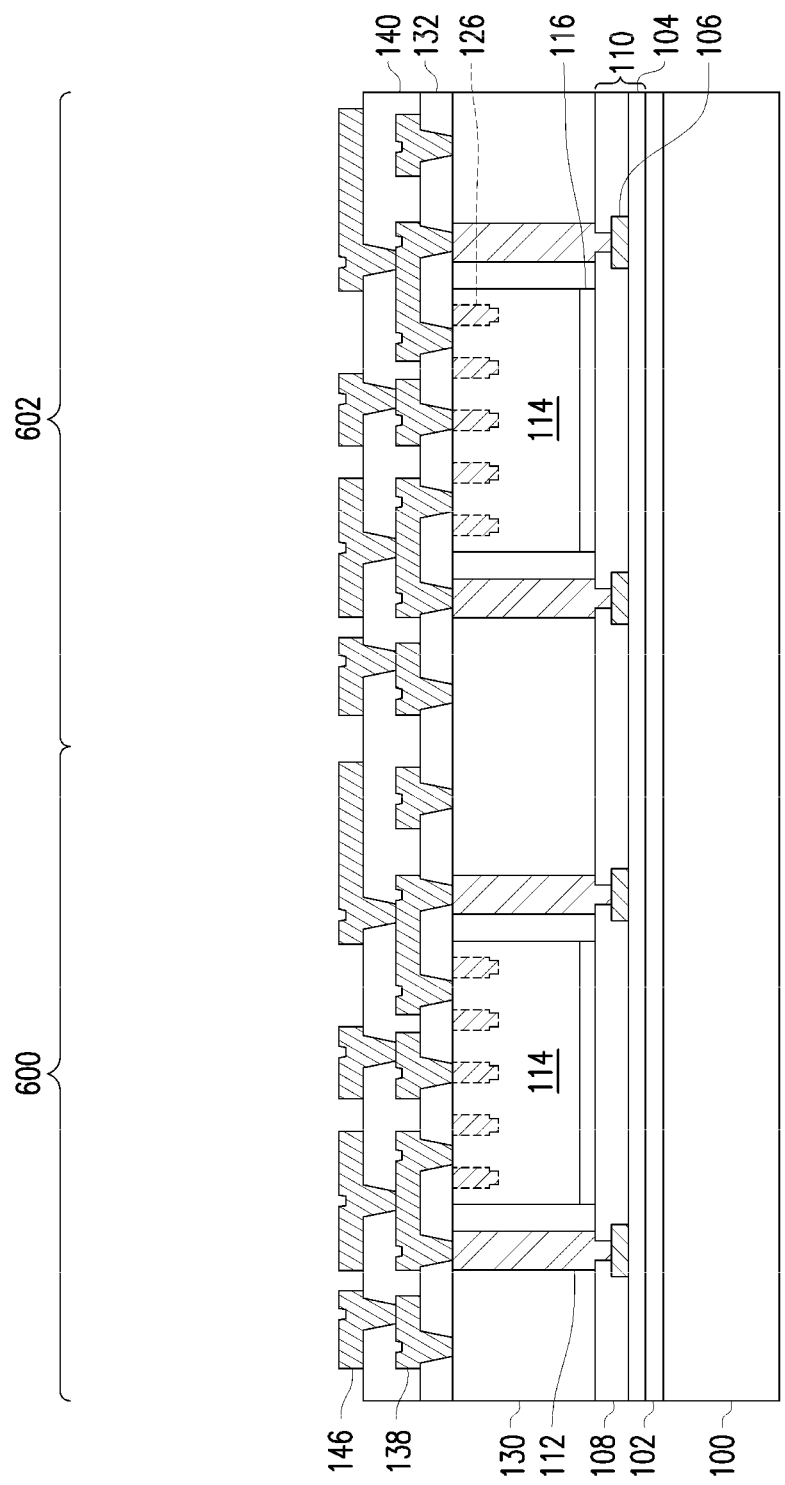
FIG. 12 illustrates a formation of a metallization pattern in accordance with some embodiments.

In FIG. 12, a metallization pattern 146 with vias is formed on the dielectric layer 140. The metallization pattern 146 may be formed of the same or similar materials and by the same or similar methods as the metallization pattern 138. As an example of forming the metallization pattern 146, a seed layer (not separately illustrated) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like.

A photoresist (not separately illustrated) is then formed and patterned on the seed layer. The photoresist may be formed by spin coating or the like and may be exposed to a patterned energy source and developed for patterning. For example, an aligner may be used to expose the photoresist to the patterned energy source (e.g., a patterned light source) such that an entire surface of the photoresist formed over the carrier substrate 100 is exposed simultaneously. The pattern of the photoresist corresponds to the metallization pattern 146. The patterning forms openings through the photoresist to expose the seed layer.

A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are then removed. The photoresist may be removed by an acceptable ashing or stripping process, such as using an oxygen plasma or the like. Once the photoresist is removed, exposed portions of the seed layer are removed using an acceptable etching process, such as a wet etching process or a dry etching process. The remaining portions of the seed layer and the conductive material form the metallization pattern 146 and the vias. The vias are formed in the openings through the dielectric layer 140 to, e.g., portions of the metallization pattern 138. Because openings were formed in the dielectric layer 140 by an aligner, rather than a stepper or the like, the metallization pattern 146 is free from stitching and any overlay shift is less than about 2 μm, between about 0.3 μm and about 0.1 μm, or about 0 μm.

Figure 13:
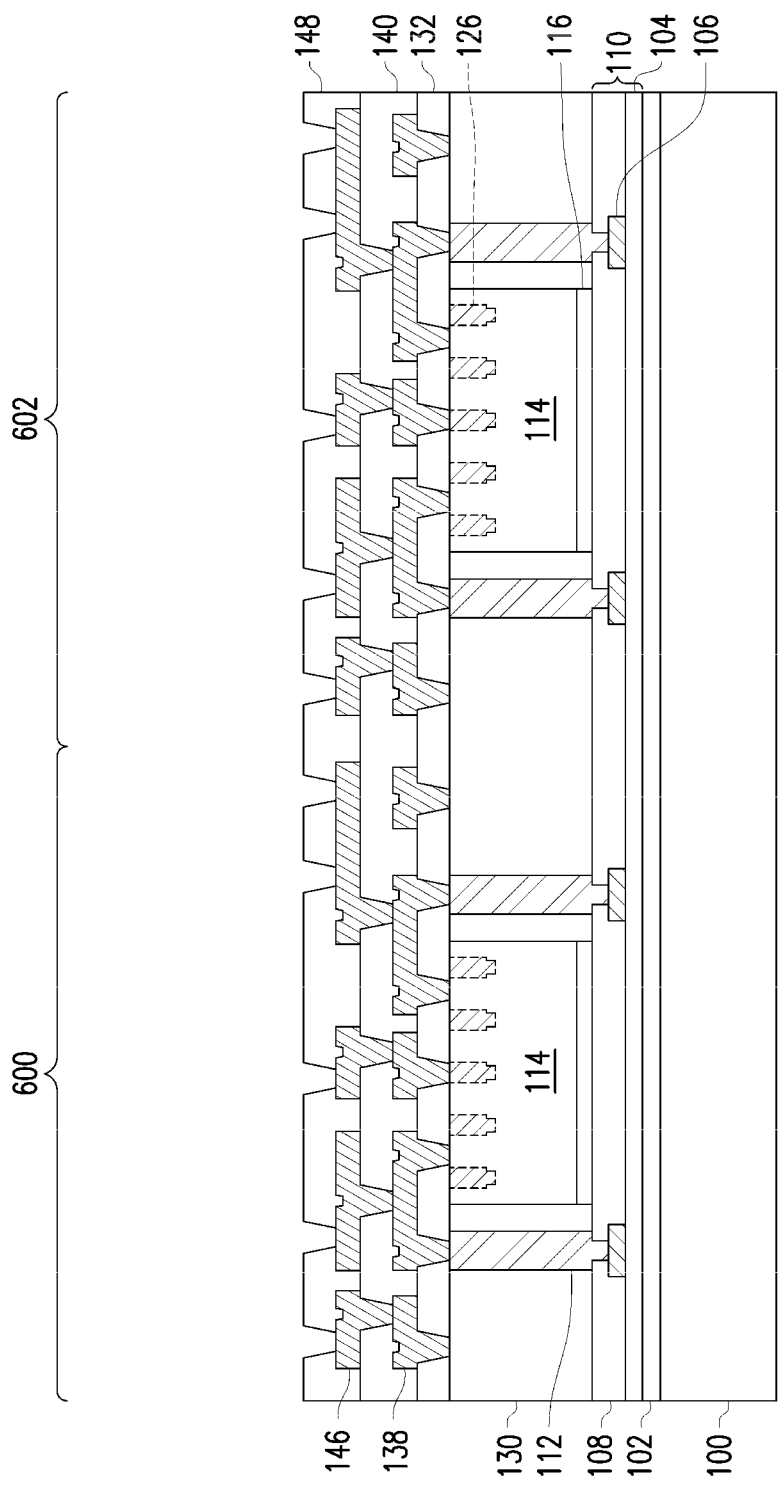
FIG. 13 illustrates a formation of a dielectric layer in accordance with some embodiments.

In FIG. 13, a dielectric layer 148 is deposited on the metallization pattern 146 and the dielectric layer 140. The dielectric layer 148 may be formed of the same or similar materials and by the same or similar methods as the dielectric layer 132. For example, in some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. In embodiments in which the dielectric layer 148 is formed of a material which is not photo-sensitive, the dielectric layer 148 may be patterned by forming a photoresist (not separately illustrated) over the dielectric layer 148, patterning the photoresist by the methods described below, and etching through the photoresist to pattern the dielectric layer 148. The dielectric layer 148 may be formed by spin coating, lamination, CVD, the like, or a combination thereof. The dielectric layer 148 may be patterned and planarized by the same or similar methods to the dielectric layer 132. For example, the dielectric layer 148 may be exposed using an aligner, developed to form openings extending through the dielectric layer 148 and exposing portions of the metallization pattern 146, and planarized using a process such as a CMP process, grinding, or an etch planarization process, as described above in reference to the dielectric layer 132. In some embodiments, the dielectric layer 148 may be planarized before forming the openings exposing the portions of the metallization pattern 146.

Figure 14:
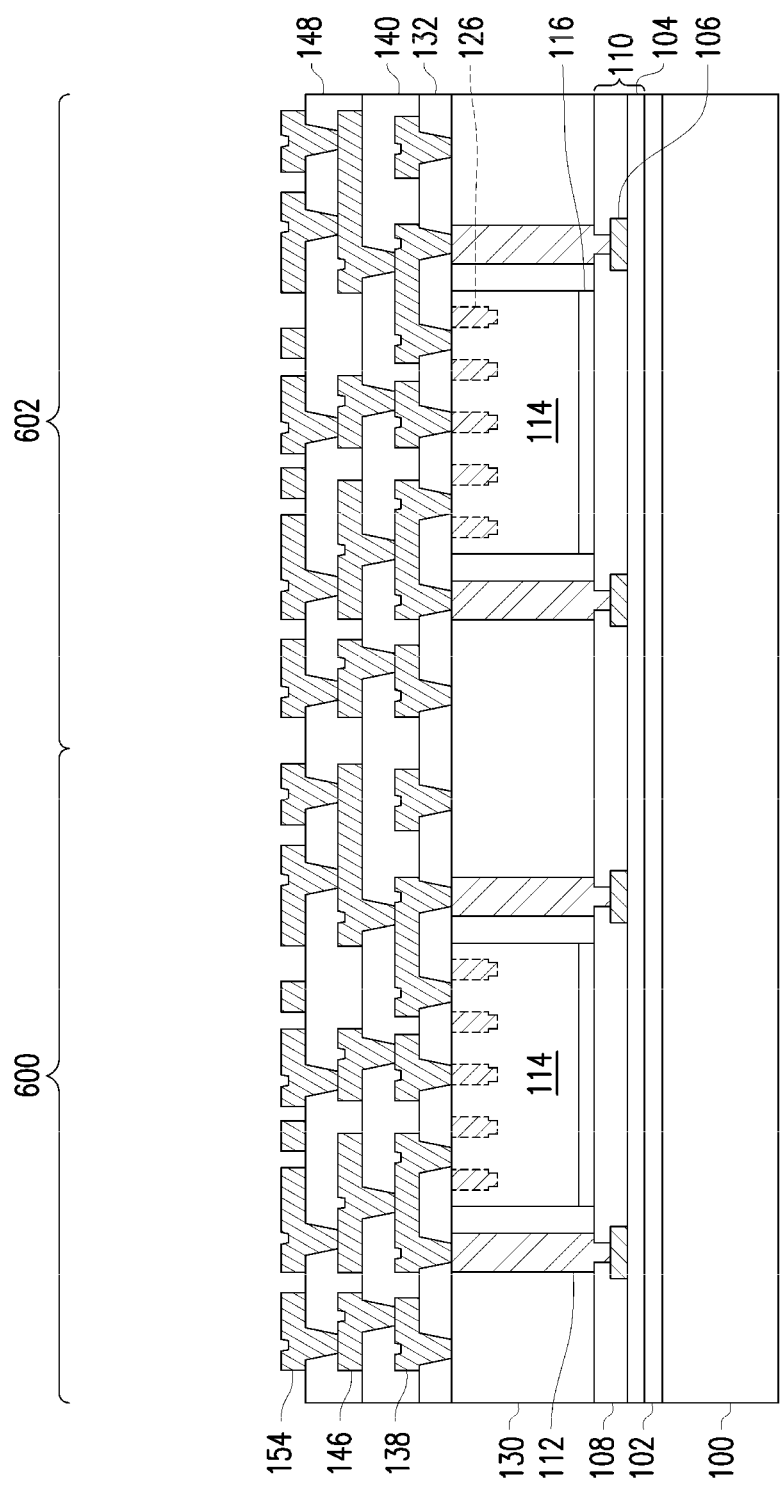
FIG. 14 illustrates a formation of a metallization pattern in accordance with some embodiments.

In FIG. 14, a metallization pattern 154 with vias is formed on the dielectric layer 148. The metallization pattern 154 may be formed of the same or similar materials and by the same or similar methods as the metallization pattern 138. As an example of forming the metallization pattern 154, a seed layer (not separately illustrated) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like.

A photoresist (not separately illustrated) is then formed and patterned on the seed layer. The photoresist may be formed by spin coating or the like and may be exposed to a patterned energy source and developed for patterning. For example, an aligner may be used to expose the photoresist to the patterned energy source (e.g., a patterned light source) such that an entire surface of the photoresist formed over the carrier substrate 100 is exposed simultaneously. The pattern of the photoresist corresponds to the metallization pattern 154. The patterning forms openings through the photoresist to expose the seed layer.

A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are then removed. The photoresist may be removed by an acceptable ashing or stripping process, such as using an oxygen plasma or the like. Once the photoresist is removed, exposed portions of the seed layer are removed using an acceptable etching process, such as a wet etching process or a dry etching process. The remaining portions of the seed layer and the conductive material form the metallization pattern 154 and the vias. The vias are formed in the openings through the dielectric layer 148 to, e.g., portions of the metallization pattern 146. Because openings were formed in the dielectric layer 148 by an aligner, rather than a stepper or the like, the metallization pattern 154 is free from stitching and any overlay shift is less than about 2 µm, between about 0.3 µm and about 0.1 µm, or about 0 µm.

Figure 15:
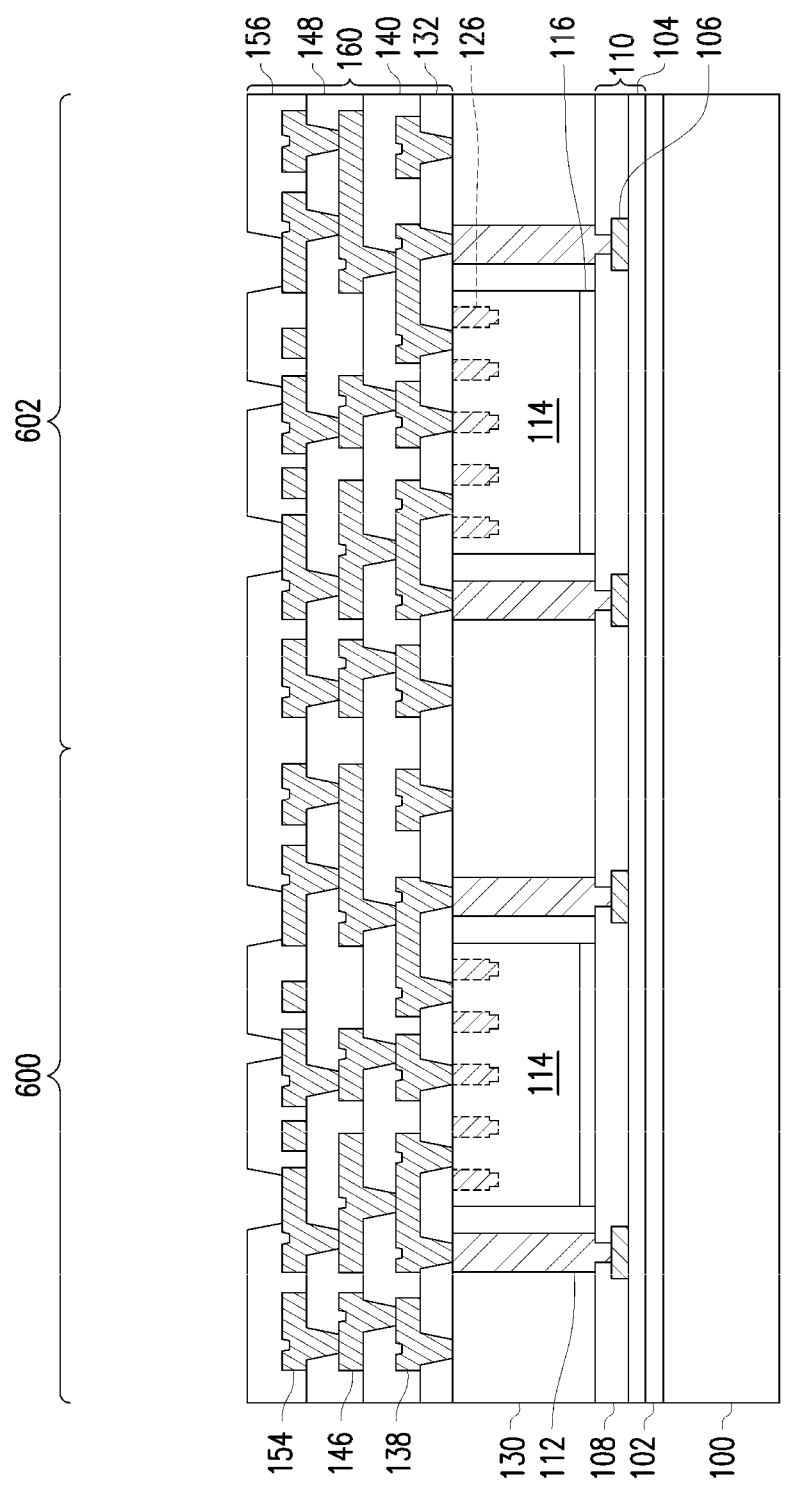
FIG. 15 illustrates a formation of a dielectric layer in accordance with some embodiments.

In FIG. 15, the dielectric layer 156 is deposited on the metallization pattern 154 and the dielectric layer 148. The dielectric layer 156 may be formed of the same or similar materials and by the same or similar methods as the dielectric layer 132. For example, in some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. In embodiments in which the dielectric layer 156 is formed of a material which is not photo-sensitive, the dielectric layer 156 may be patterned by forming a photoresist (not separately illustrated) over the dielectric layer 156, patterning the photoresist by the methods described below, and etching through the photoresist to pattern the dielectric layer 156. The dielectric layer 156 may be formed by spin coating, lamination, CVD, the like, or a combination thereof. The dielectric layer 156 may be patterned and planarized by the same or similar methods to the dielectric layer 132. For example, the dielectric layer 156 may be exposed using an aligner, developed to form openings extending through the dielectric layer 156 and exposing portions of the metallization pattern 154, and planarized using a process such as a CMP process, grinding, or an etch planarization process, as described above in reference to the dielectric layer 132. In some embodiments, the dielectric layer 156 may be planarized before forming the openings exposing the portions of the metallization pattern 154.

The front-side redistribution structure 160 including the dielectric layer 132, the dielectric layer 140, the dielectric layer 148, and the dielectric layer 156 and the metallization pattern 138, the metallization pattern 146, and the metallization pattern 154 illustrated in FIG. 15 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 16:
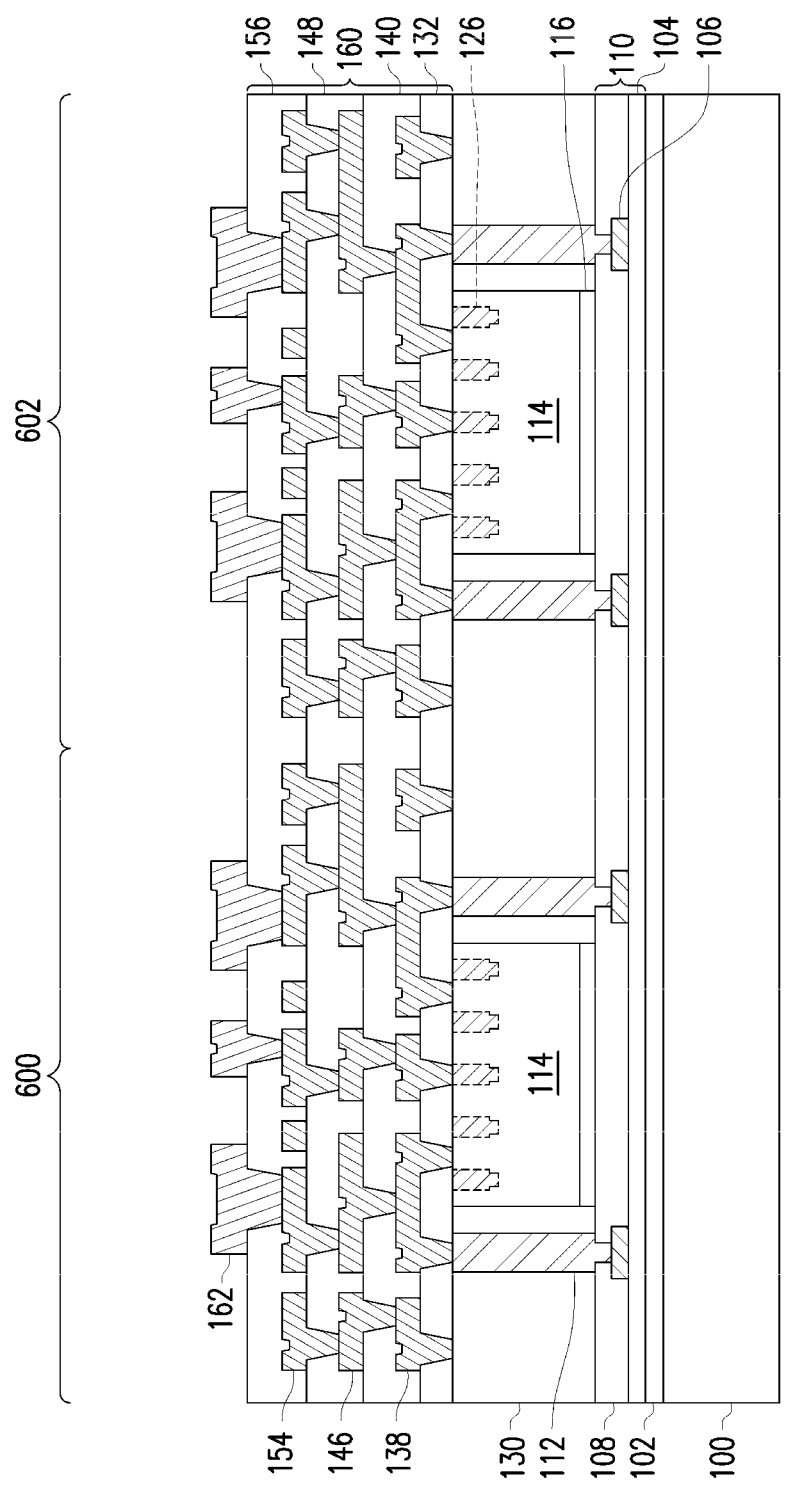
FIG. 16 illustrates a formation of under bump metallizations in accordance with some embodiments.

In FIG. 16, underbump metallizations (UBMs) 162 are formed on an exterior side of the front-side redistribution structure 160. The UBMs 162 are used to couple to conductive connectors 166 and integrated passive devices (IPDs) 188 to the front-side redistribution structure 160 (see, e.g., FIG. 17). In the illustrated embodiment, the UBMs 162 are formed through openings in the dielectric layer 156 to the metallization pattern 154. The UBMs 162 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 162. Any suitable materials or layers of material that may be used for the UBMs 162 are fully intended to be included within the scope of the embodiments.

In an embodiment, the UBMs 162 are formed by forming each individual layer over the metallization pattern 154 and along the interior of the openings through the dielectric layer 156. The forming of each layer may be performed using a plating process, such as electrochemical plating, although other processes of formation, such as sputtering, evaporation, or a plasma-enhanced chemical vapor deposition (PECVD) process, may be used depending upon the desired materials.

Figure 17:
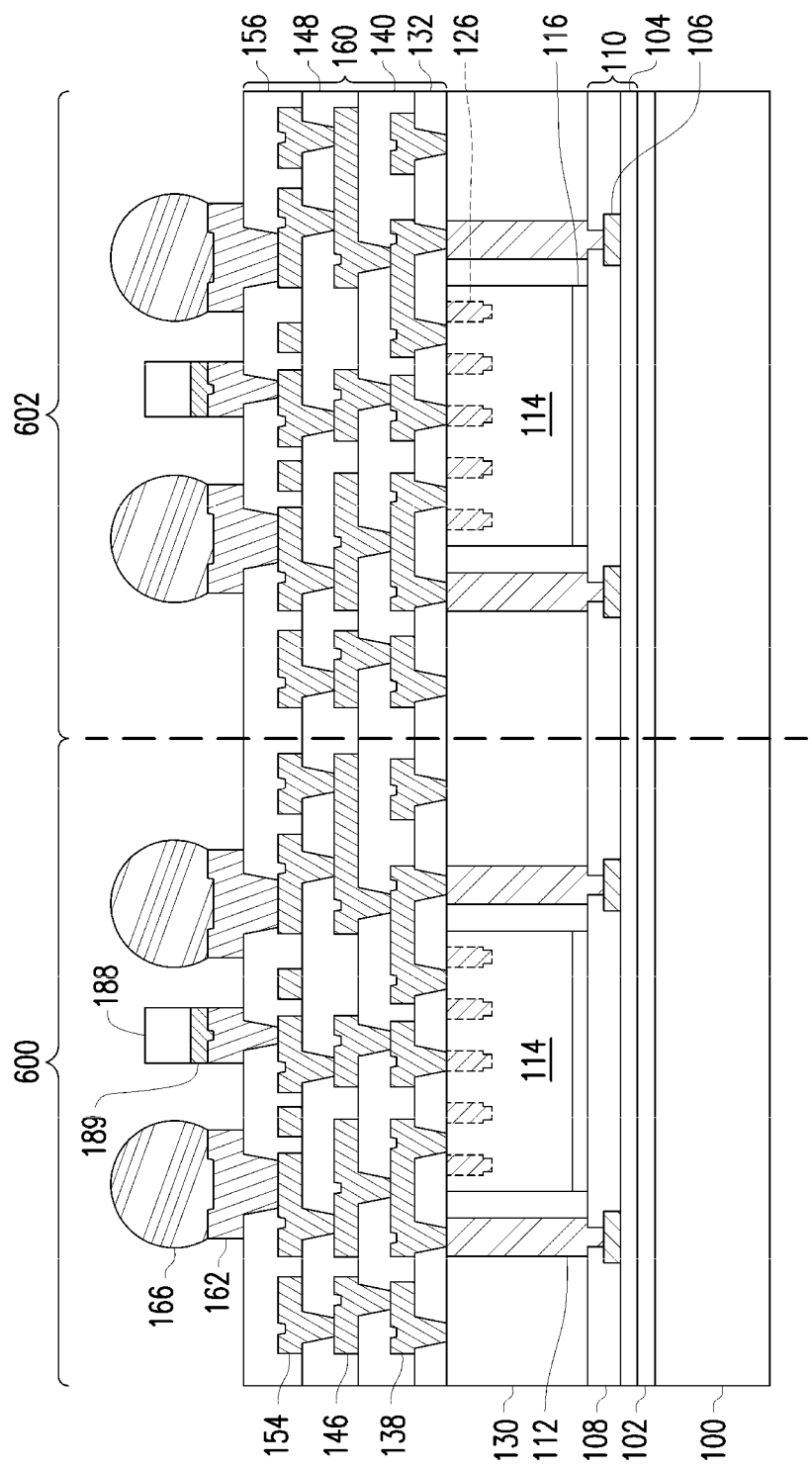
FIG. 17 illustrates a formation of conductive connectors and a placement of integrated passive devices in accordance with some embodiments.

In FIG. 17, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the conductive connectors 166. The metal cap layer may include nickel, tin, tin-lead, gold, silver, palladium, indium, nickel-palladium-gold, nickel-gold, the like, or a combination thereof and may be formed by a plating process.

As further illustrated in FIG. 17, integrated passive devices (IPDs) 188 are attached to the front-side redistribution structure 160. The IPDs 188 are electrically connected to the front-side redistribution structure 160, and the front-side redistribution structure 160 may be electrically connected to the integrated circuit dies 114. In an embodiment, the bottommost via (e.g., metallization pattern 138) of the front-side redistribution structure 160 is electrically and physically connected to one of the die connectors 126 of each of the integrated circuit dies 114, and the UBMs 162 are electrically and physically connected to the IPDs 188.

Before being bonded to the front-side redistribution structure 160, the IPDs 188 may be processed according to applicable manufacturing processes. For example, the IPDs 188 may comprise one or more passive devices in a main structure of the IPDs 188. The main structure may include a substrate and/or an encapsulant. In the embodiments including a substrate, the substrate may be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, a resistor, an inductor, the like, or a combination thereof. The passive devices may be formed in and/or on the semiconductor substrate and/or within the encapsulant and may be interconnected by interconnect structures formed by, for example, metallization patterns in one or more dielectric layers on the main structure to form the IPDs 188. The IPDs 188 may be surface mount devices (SMDs), 2-terminal IPDs, multi-terminal IPDs, or other types of passive devices. The IPDs 188 are electrically and physically connected to the UBMs 162 with conductive connectors 189, thereby coupling the front-side redistribution structure 160 to the IPDs 188. The conductive connectors 189 may be similar to the conductive connectors 166, or may be different.

Figure 18:
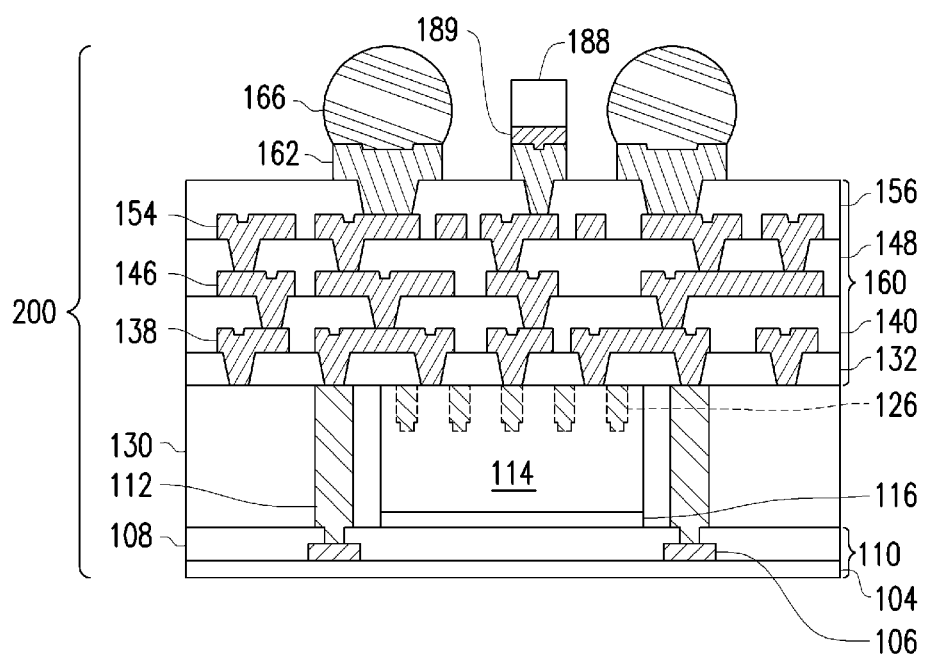
FIG. 18 illustrates a formation of a first package in accordance with some embodiments.

In FIG. 18, a carrier de-bonding process and a dicing process may be performed to singulate the plurality of semiconductor devices formed over the carrier substrate 100 into individual semiconductor packages 200. The device of FIG. 17 may be flipped over (not separately illustrated) and the conductive connectors 166 may be attached to a tape (not separately illustrated) supported by a frame (not separately illustrated). The tape may be a dicing tape, which may be adhesive, for holding the device in place in subsequent processing. Next, the carrier substrate 100 is detached (de-bonded) from the device through a de-bonding process. The de-bonding process may remove the carrier substrate 100 using any suitable process, such as etching, grinding, and mechanical peel off. In some embodiments, the carrier substrate 100 is de-bonded by shining a laser or UV light over the surface of the carrier substrate 100. The laser or UV light breaks the chemical bonds of the release layer 102 and the carrier substrate 100 can then be easily detached. A dicing process may be performed after the carrier de-bonding process to singulate the plurality of semiconductor devices formed over the carrier substrate 100 into individual semiconductor packages 200. The individual semiconductor packages 200 may be singulated along the dashed line between the first package region 600 and the second package region 602 illustrated in FIG. 17 by a process such as sawing, dicing, or the like. In some embodiments, the semiconductor package 200 may have a size of 1 mm by 1 mm, between 1 mm by 1 mm and 300 mm by 300 mm, or less than 300 mm by 300 mm.

Planarizing the dielectric layer 132, the dielectric layer 140, the dielectric layer 148, and the dielectric layer 156 improves the degree of planarization of the dielectric layer 132, the dielectric layer 140, the dielectric layer 148, and the dielectric layer 156 and the overall structure of the individual semiconductor packages 200. Planarizing the dielectric layer 132, the dielectric layer 140, the dielectric layer 148, and the dielectric layer 156 before forming the metallization pattern 138, the metallization pattern 146, the metallization pattern 154, and the UBMs 162 helps to enlarge the lithographic processing window such that the entire surface of the dielectric layer or photoresist to be patterned can be simultaneously exposed using an aligner, rather than exposing frames on the surface of the dielectric layer or the photoresist to be patterned one at a time in a shot-by-shot process using a stepper. As described above, using the aligner rather than the stepper makes it so that there is no stitching between frames, and reduces any overlay shift in the subsequently formed metallization pattern or UBM.

In accordance with an embodiment, a method includes encapsulating an integrated circuit die and a through via in a molding compound, the integrated circuit die having a die connector; depositing a first dielectric layer over the molding compound; patterning a first opening through the first dielectric layer exposing the die connector of the integrated circuit die; planarizing the first dielectric layer; depositing a first seed layer over the first dielectric layer and in the first opening; and plating a first conductive via extending through the first dielectric layer on the first seed layer. In an embodiment, the planarizing the first dielectric layer includes a chemical mechanical planarization (CMP) process. In an embodiment, the patterning the first opening includes exposing the first dielectric layer to light using an aligner. In an embodiment, the patterning the first opening includes exposing the first dielectric layer to a patterned energy source, and an entire top surface of the first dielectric layer is exposed to the patterned energy source simultaneously. In an embodiment, the method further includes depositing a photoresist over the first seed layer and exposing the photoresist to a patterned energy source using an aligner. In an embodiment, the exposing the photoresist to the patterned energy source includes bringing a photomask into contact with a top surface of the first dielectric layer, the photomask covering the entire top surface of the first dielectric layer. In an embodiment, the method further includes depositing a second dielectric layer over the first dielectric layer and the first conductive via; patterning a second opening through the second dielectric layer exposing the first conductive via; planarizing the first dielectric layer; depositing a second seed layer over the second dielectric layer and in the second opening; and plating a second conductive via extending through the second dielectric layer on the second seed layer.

In accordance with another embodiment, a method includes encapsulating a plurality of integrated circuit dies in a molding compound, each one of the plurality of integrated circuit dies being disposed on a wafer, each one of the plurality of integrated circuit dies having a die connector; depositing a first dielectric layer over the molding compound and the plurality of integrated circuit dies; simultaneously exposing an entire upper surface of the first dielectric layer to a first patterned energy source; developing the first dielectric layer to form a first plurality of openings exposing the plurality of integrated circuit dies; planarizing the first dielectric layer; and forming a first metallization pattern through the first dielectric layer, the first metallization pattern contacting the die connectors. In an embodiment, the forming the first metallization pattern includes forming a seed layer over the first dielectric layer; forming a photoresist over the seed layer; simultaneously exposing an entire upper surface of the photoresist to a second patterned energy source; developing the photoresist to form a second plurality of openings exposing the seed layer; and plating a conductive material in the second plurality of openings. In an embodiment, the method further includes depositing a second dielectric layer over the first dielectric layer and the first metallization pattern; simultaneously exposing an entire upper surface of the second dielectric layer to a second patterned energy source; developing the second dielectric layer to form a second plurality of openings exposing the first metallization pattern; planarizing the second dielectric layer; and forming a second metallization pattern through the second dielectric layer, the second metallization pattern contacting the first metallization pattern, the second metallization pattern having an overlay shift of less than 2 µm with respect to the first metallization pattern. In an embodiment, the first dielectric layer is planarized after the developing the first dielectric layer. In an embodiment, the entire upper surface of the first dielectric layer is exposed by projecting an energy source through a mask, the mask producing the first patterned energy source. In an embodiment, the mask has a diameter substantially identical to a diameter of the wafer. In an embodiment, the first dielectric layer is planarized before the simultaneously exposing the entire upper surface of the first dielectric layer.

In accordance with yet another embodiment, a device includes a molding compound; an integrated circuit die encapsulated in the molding compound; a through via adjacent the integrated circuit die, the molding compound extending between the through via and the integrated circuit die; and a redistribution structure over the integrated circuit die, the molding compound, and the through via, the redistribution structure being electrically connected to the integrated circuit die and the through via, the redistribution structure including a first dielectric layer disposed over the molding compound; and a first conductive feature extending through the first dielectric layer, the first conductive feature being free from stitching. In an embodiment, the first conductive feature includes a first conductive via extending through the first dielectric layer and a first conductive line extending over the top surface of the first dielectric layer; and the redistribution structure further includes a second dielectric layer disposed over the first dielectric layer and the first conductive feature, a top surface of the second dielectric layer having a first degree of planarization between 48 percent and 100 percent; and a second conductive feature extending through the second dielectric layer to contact the first conductive feature. In an embodiment, the device further includes a topmost dielectric layer disposed over the first dielectric layer and the first conductive feature, wherein a top surface of the topmost dielectric layer has a second degree of planarization between 48 percent and 100 percent; and a UBM extending through the topmost dielectric layer. In an embodiment, the device further includes an integrated passive device attached to the UBM. In an embodiment, a top surface of the first dielectric layer has a first degree of planarization between 48 percent and 100 percent. In an embodiment, a pitch of the first conductive feature is equal to or less than 2 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   encapsulating an integrated circuit die and a through via in a molding compound, the integrated circuit die having a die connector;
   depositing a non-planar first dielectric layer over the molding compound;
   patterning a first opening through the non-planar first dielectric layer exposing the die connector of the integrated circuit die, wherein the patterning the first opening comprises exposing a top surface of the non-planar first dielectric layer to a patterned energy source using a proximity aligner, wherein a proximity photomask is separated from the top surface of the non-planar first dielectric layer while exposing the top surface of the non-planar first dielectric layer to the patterned energy source;
   after patterning the first opening through the non-planar first dielectric layer, planarizing the non-planar first dielectric layer such that the first dielectric layer comprises a planar top surface;
   depositing a first seed layer over the planar top surface of the first dielectric layer and in the first opening; and
   plating a first conductive via extending through the planar top surface of the first dielectric layer on the first seed layer.

2. The method of claim 1, wherein the planarizing the non-planar first dielectric layer comprises a chemical mechanical planarization (CMP) process.

3. The method of claim 1, wherein an entirety of the top surface of the non-planar first dielectric layer is exposed to the patterned energy source simultaneously.

4. The method of claim 1, further comprising depositing a photoresist over the first seed layer and exposing the photoresist to a second patterned energy source using an aligner.

5. The method of claim 4, wherein an entire top surface of the photoresist is exposed to the second patterned energy source simultaneously.

6. The method of claim 1, further comprising:
depositing a second dielectric layer over the planar top surface of the first dielectric layer and the first conductive via;
patterning a second opening through the second dielectric layer exposing the first conductive via;
planarizing the second dielectric layer;
depositing a second seed layer over the second dielectric layer and in the second opening; and
plating a second conductive via extending through the second dielectric layer on the second seed layer.

7. The method of claim 1, wherein the proximity photomask is separated from the top surface of the non-planar first dielectric layer by a gap ranging from about 10 mm to about 150 mm, and wherein the gap is filled with nitrogen.

8. A method comprising:
encapsulating a plurality of integrated circuit dies in a molding compound, each one of the plurality of integrated circuit dies being disposed on a wafer, each one of the plurality of integrated circuit dies having a die connector;
depositing a first dielectric layer over the molding compound and the plurality of integrated circuit dies, wherein the first dielectric layer is deposited with a non-planar top surface;
simultaneously exposing an entirety of an upper surface of the first dielectric layer to a first patterned energy source using a contact aligner, wherein exposing the first dielectric layer to the first patterned energy comprises bringing a contact photomask into direct contact with the upper surface of the first dielectric layer;
developing the first dielectric layer to form a first plurality of openings exposing the plurality of integrated circuit dies;
planarizing the first dielectric layer; and
forming a first metallization pattern through the first dielectric layer, the first metallization pattern contacting the die connectors.

9. The method of claim 8, wherein the forming the first metallization pattern comprises:
forming a seed layer over the first dielectric layer;
forming a photoresist over the seed layer;
simultaneously exposing an entire upper surface of the photoresist to a second patterned energy source;
developing the photoresist to form a second plurality of openings exposing the seed layer; and
plating a conductive material in the second plurality of openings.

10. The method of claim 8, further comprising:
depositing a second dielectric layer over the first dielectric layer and the first metallization pattern;
simultaneously exposing an entire upper surface of the second dielectric layer to a second patterned energy source;
developing the second dielectric layer to form a second plurality of openings exposing the first metallization pattern;
planarizing the second dielectric layer; and
forming a second metallization pattern through the second dielectric layer, the second metallization pattern contacting the first metallization pattern, wherein the second metallization pattern has an overlay shift of less than 2 μm with respect to the first metallization pattern.

11. The method of claim 8, wherein the first dielectric layer is planarized after the developing the first dielectric layer.

12. The method of claim 8, wherein the entire upper surface of the first dielectric layer is exposed by projecting an energy source through a mask, wherein the mask produces the first patterned energy source.

13. The method of claim 12, wherein the mask has a diameter substantially identical to a diameter of the wafer.

14. The method of claim 8, wherein the first dielectric layer is planarized before the simultaneously exposing the entire upper surface of the first dielectric layer.

15. A method comprising:
encapsulating an integrated circuit die and a through via adjacent the integrated circuit die with a molding compound; and
forming a redistribution structure over the integrated circuit die, the molding compound, and the through via, wherein forming the redistribution structure comprises:
depositing a first dielectric layer having a non-planar surface over the integrated circuit die, the through via, and the molding compound;
patterning the first dielectric layer to form first openings extending through the first dielectric layer, the first openings exposing surfaces of the through via and the integrated circuit die, wherein patterning the first dielectric layer comprises exposing an upper surface of the first dielectric layer to a first patterned energy source using a proximity aligner, wherein a proximity photomask is separated from the upper surface of the first dielectric layer while exposing the upper surface of the first dielectric layer to the first patterned energy source;
after the patterning the first dielectric layer, planarizing the first dielectric layer; and
depositing first conductive features in the first openings, the first conductive features being electrically connected to the integrated circuit die and the through via.

16. The method of claim 15, wherein the patterning the first dielectric layer comprises exposing an entire upper surface of the first dielectric layer to a patterned energy source.

17. The method of claim 16, wherein an aligner is used to expose the entire upper surface of the first dielectric layer to the patterned energy source.

18. The method of claim 15, further comprising:
depositing a second dielectric layer over the first dielectric layer and the first conductive features;
patterning the second dielectric layer to form second openings extending through the second dielectric layer, the second openings exposing surfaces of the first conductive features;
after the patterning the second dielectric layer, planarizing the second dielectric layer; and
depositing second conductive features in the second openings, the second conductive features being electrically connected to the first conductive features.

19. The method of claim 15, wherein the first dielectric layer is planarized to a degree of planarization greater than 95 percent.

20. The method of claim 15, wherein the first openings are patterned with a pitch of equal to or less than 2 µm.

* * * * *